US010824438B2

(12) United States Patent
Lu et al.

(10) Patent No.: US 10,824,438 B2
(45) Date of Patent: *Nov. 3, 2020

(54) RADIO NODE DEVICE AND BACKHAUL CONNECTION METHOD THEREOF

(71) Applicant: Cloud Network Technology Singapore Pte. Ltd., Singapore (SG)

(72) Inventors: Chi-Chang Lu, New Taipei (TW); Cheng-Yi Hsieh, New Taipei (TW)

(73) Assignee: CLOUD NETWORK TECHNOLOGY SINGAPORE PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/284,049

(22) Filed: Feb. 25, 2019

(65) Prior Publication Data

US 2019/0187999 A1 Jun. 20, 2019

Related U.S. Application Data

(60) Continuation-in-part of application No. 15/439,944, filed on Feb. 23, 2017, now Pat. No. 10,264,445.
(Continued)

(30) Foreign Application Priority Data

Mar. 30, 2010 (CN) .......................... 2010 1 0136237

(51) Int. Cl.
*G06F 9/4401* (2018.01)
*G06F 9/445* (2018.01)
*H04B 7/26* (2006.01)
*H04W 56/00* (2009.01)
*H04W 84/04* (2009.01)
*G11C 13/00* (2006.01)

(52) U.S. Cl.
CPC .............. *G06F 9/442* (2013.01); *G06F 9/445* (2013.01); *G06F 9/4406* (2013.01); *G11C 13/0004* (2013.01); *H04B 7/2606* (2013.01); *H04W 56/0015* (2013.01); *H04W 84/047* (2013.01); *G06F 9/44505* (2013.01)

(58) Field of Classification Search
CPC .... G06F 9/442; G06F 9/4406; H04W 84/047; H04W 88/04
See application file for complete search history.

(56) References Cited

U.S. PATENT DOCUMENTS

| 10,264,445 | B2* | 4/2019 | Lu | ........................... H04W 8/24 |
| 2007/0160020 | A1* | 7/2007 | Osann | ..................... H04L 45/24 370/338 |

(Continued)

*Primary Examiner* — Vincent H Tran
(74) *Attorney, Agent, or Firm* — ScienBiziP, P.C.

(57) ABSTRACT

A radio node device executes a backhaul connection method. The radio node device receives a radio access network issued configuration message requesting multi-connectivity capability of the relay node device. The radio node device provides two wireless communication channels in parallel as a part of a wireless backhaul channel to a radio access network entity in response to the configuration message. The relay node device serves as an intermediate node in the wireless backhaul channel. The relay node device performs route selection for the wireless backhaul channel based on metrics of relay nodes.

16 Claims, 15 Drawing Sheets

Related U.S. Application Data which is a continuation-in-part of application No. 14/558,728, filed on Dec. 3, 2014, now Pat. No. 9,619,246, which is a continuation-in-part of application No. 13/853,221, filed on Mar. 29, 2013, now Pat. No. 8,935,522, which is a division of application No. 12/768,738, filed on Apr. 28, 2010, now Pat. No. 8,443,182.

(56) References Cited

U.S. PATENT DOCUMENTS

| | | | |
|---|---|---|---|
| 2013/0035033 A1* | 2/2013 | Sanneck | H04W 24/04 455/9 |
| 2013/0095747 A1* | 4/2013 | Moshfeghi | H04W 72/085 455/7 |
| 2014/0254471 A1* | 9/2014 | Fang | H04W 84/047 370/329 |
| 2015/0103769 A1* | 4/2015 | Kaichis | H04W 16/04 370/329 |
| 2016/0192439 A1* | 6/2016 | Phuyal | H04L 5/0048 370/315 |
| 2016/0211987 A1* | 7/2016 | Fidi | H04L 12/4035 |
| 2017/0019811 A1* | 1/2017 | Parulkar | H04L 47/22 |
| 2017/0070892 A1* | 3/2017 | Song | H04L 41/042 |
| 2017/0318586 A1* | 11/2017 | Wang | H04W 72/0453 |

* cited by examiner

RADIO NODE DEVICE AND BACKHAUL CONNECTION METHOD THEREOF

CROSS-REFERENCE TO RELATED APPLICATIONS

This application is a continuation in part of U.S. application Ser. No. 15/439,944, entitled "RELAY USER EQUIPMENT DEVICE AND CAPABILITY DISCOVERY METHOD THEREOF", filed on Feb. 23, 2017, published as US20170164187A1, which is a continuation in part of U.S. application Ser. No. 14/558,728, entitled "ELECTRONIC COMPUTING DEVICE AND REBOOT METHOD THEREOF", filed on Dec. 3, 2014, published as US20150089105A1, which is a continuation in part of U.S. application Ser. No. 13/853,221, entitled "ELECTRONIC COMPUTING DEVICE AND REBOOT METHOD EXECUTABLE BY SAME", filed on Mar. 29, 2013, published as US20130227265A1, which is a divisional of U.S. application Ser. No. 12/768,738, entitled "MEDIA DATA PLAYBACK DEVICE AND REBOOT METHOD THEREOF", filed on Apr. 28, 2010, published as US20110246758A1, which is based upon and claims the benefit of priority from Chinese Patent Application No. 201010136237.4, filed Mar. 30, 2010 in the People's Republic of China. The entirety of each of the above-mentioned patent applications is hereby incorporated by reference herein.

BACKGROUND

1. Technical Field

The disclosure relates to computer technologies, and more particularly to a media data playback system and reboot method thereof.

2. Description of Related Art

Internet of Things (IoT) is an ecosystem of a wide variety of devices. The devices may be located at different places. Each device may have different attributes and different capabilities. Managing heterogeneous devices in the IoT, such as setting IoT device attributes, may become difficult. As industry and research efforts are to bring IoT not only into the manufacturing field and factories but also consumer's premises, managing IoT device is an important topic.

DETAILED DESCRIPTION

Description of embodiments of electronic computing device and reboot method thereof is given in the following paragraphs which are organized as:
1. System Overview
   1.1 Exemplary Media Data Playback Device
   1.2 Exemplary Embodiments of Main Memory
2. Exemplary operations of the media data playback device
   2.1 Operations Before Device Shutdown
   2.2 Operations During Device Bootstrapping
3 Variations
4. Conclusion Note that although terminology from 3rd Generation Partnership Project (3GPP) long term evolution (LTE) has been used in this disclosure to exemplify the devices, network entities, interfaces and interactions between the entities, this should not be seen as limiting the scope of the disclosure to only the aforementioned system. Other wireless systems, including global system for mobile (GSM), wideband code division multiple access (W-CDMA), Institute of Electrical and Electronics Engineers (IEEE) 802.16, and low power wide area network (LPWAN), may also benefit from exploiting the ideas covered within the disclosure.

1. System Overview

The disclosed electronic computing device can be implemented as a stand-alone device or integrated in various electronic computing devices, such as an IoT device, a set top box, a cell phone, a tablet personal computer (PC), a laptop computer, a monitor, a multimedia player, a digital camera, a personal digital assistant (PDA), a navigation device or a mobile internet device (MID). An example of the IoT device may be incorporated by reference to U.S. application Ser. No. 15/172,169, entitled "VOICE COMMAND PROCESSING METHOD AND ELECTRONIC DEVICE UTILIZING THE SAME", filed on Jun. 3, 2016, and published as US 20160283191A1.

1.1 Electronic Computing Device

Figure 1:
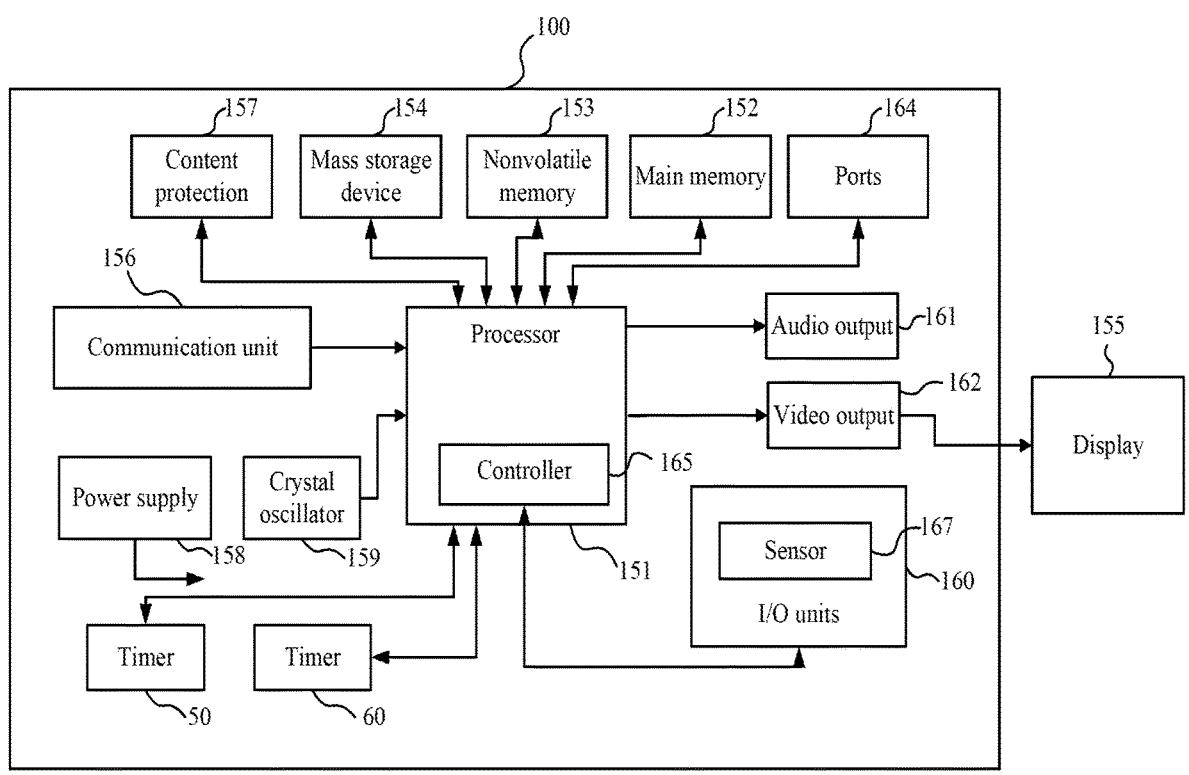
FIG. 1 is a block diagram of an embodiment of an electronic computing device.

With reference to FIG. 1, a processor 151 comprises a central processing unit of the electronic computing device 100. The processor 151 may comprise one or more various integrated circuits (ICs) for processing data and machine-readable instructions. Connection of the components in the device 100 is shown in FIG. 1 and may comprise serial or parallel transmission buses, or wireless communication channels. A communication unit 156 establishes a first set of one or more wireless communication channels, referred to as wireless backhaul connection, through which the electronic computing device 100 may connect to an e-Node B (eNB), a radio access network (RAN), a public land mobile network (PLMN), a network slice instance of the RAN and the PLMN, and to a packet data network (PDN), such as the Internet. The device 100 may download media data streams through the established wireless communication channels from a remote station or application server, such as one of the famous video sharing website or video service website on the Internet. The device 100 may connect to the PDN through a 3GPP network, such as PLMN, or non-3GPP network, such as LPWAN. Additionally, the communication unit 156 may establish a second set of one or more wireless communication channels, referred to as wireless local connection, through which one or more remote user equipment (UE) devices, such as a portable device, such as a remote control, an IoT device, a wearable device, a mobile phone, and/or a palm top computer, may connect to and exchange control signals and data with the electronic computing device 100. The wireless local connection may comprise one or more local device to device (D2D) connections each of which is direct communication between the device 100 and a remote UE device without traversing a base station (BS) or a core network. The wireless local connection may comprise one or more local access connections each of which comprises a part of an indirect connection through which the one or more remote UE devices connect to a base station and a core network via the device 100. The communication unit 156 may comprise of antennas, baseband and radio frequency (RF) chipsets for wireless local area network (LAN) communication, LPWAN, and/or cellular communication such as wideband code division multiple access (W-CDMA), high speed downlink packet access (HSDPA), long term evolution (LTE), LTE-Advance, and other beyond 4G communication technologies. The beyond 4G communication technologies may comprise new mobile communication technology referred to as 5G technology, such as IMT-2020 technology named by International Telecommunication Union (ITU). Through the established wireless communication channels, the device 100 may serve as a wireless LAN access point, hotspot, a relay user equipment (UE), or a machine type communication (MTC) gateway through which the portable device connects to the Internet. The device 100 may comprise an interface operable to convert control signals and data packets transferred between the wireless backhaul connection connected to the Internet and the wireless local connection connected to the one or more remote UE devices. Wireless LAN hotspot can be referred to U.S. Pat. Nos. 7,319,715 and 8,208,517. The relay UE may be a ProSe UE-to-network relay, evolved ProSe UE-to-network relay, ProSe UE-to-UE relay, and/or an MTC gateway device. Definition of a relay UE may be referred to 3rd Generation Partnership Project (3GPP) technical specification (TS) 22.278 V15.0.0 or later. An example of the MTC gateway may be referred to in U.S. application Ser. No. 14/919,016, entitled "MACHINE TYPE COMMUNICATION DEVICE AND MONITORING METHOD THEREOF", filed on Oct. 21, 2015, and published as US 20160044651A1. An example of the one or more remote UE devices may comprise local access devices in US 20160044651A1. An example of the wireless local connection may comprise a capillary wireless channel in US 20160044651A1.

The communication unit 156 may include a first set of communication circuitry operable to function as mobile terminal, such as a wireless LAN mobile terminal or a UE device, and a second set of communication circuitry operable to function as a relay or an access point, such as a wireless LAN mobile access point (AP), a MTC gateway, or a relay UE. Each of the first and second sets of communication circuitry antennas, baseband and radio frequency (RF) chipsets for wireless communication. The device 100 may utilize the second set of communication circuitry to establish a wireless communication channel of 3GPP or non-3GPP communication as wireless backhaul connecting to a core network and the Internet. The device 100 may utilize the first set of communication circuitry to transmit initial signaling, such as wireless LAN beacons, and establish a wireless local communication channel of 3GPP or non-3GPP communication for radio access by other mobile devices or remote UE devices.

The processor 151 may be packaged as a chip or comprise a plurality of chips interconnected through buses. For example, the processor 151 may only comprise of a central processing unit (CPU) or a combination of a CPU, a digital signal processor (DSP), and a chip of a communication controller, such as a chip of the communication unit 156. The communication controller may comprise one or more controllers of wired or wireless communication, such as a cellular communication, infrared, Bluetooth™, or wireless local area network (LAN) communication. The communication controller coordinates communication among components of the electronic computing device 100 or communication between the electronic computing device 100 and external devices.

A power supply 158 provides electrical power to components of the electronic computing device 100. A crystal oscillator 159 provides clock signals to the processor 151 and other components of the electronic computing device 100. The timers 50 and 60 keep track of predetermined time intervals and may comprise of circuits, machine-readable programs, or a combination thereof. Each of the timers 50 and 60 generates signals to notify expiration of the predetermined time intervals. Input and output (I/O) units 160 may comprise control buttons, an alphanumeric keypad, a touch panel, a touch screen, and a plurality of light emitting diodes (LEDs). A controller 165 detects operations on the I/O units 160 and transmits signals indicative of the detected operations to the processor 151. The controller 165 also controls operations of the I/O units 160. The processor 151 may control the I/O units 160 through the controller 165. Ports 164 may be used to connect to various computerized interfaces, such as an external computer, or a peripheral device. The ports 164 may comprise physical ports complying with universal serial bus (USB) and IEEE 1394 standards, recommended standard 232 (RS-232) and/or recommended standard 11 (RS-11) defined by Electronics Industries Association (EIA), serial ATA (SATA), and/or high-definition multimedia interface (HDMI).

A content protection system 157 provides access control to digital content reproduced by the device 100. The content protection system 157 may comprise memory and necessary devices for implementing digital video broadcasting—common interface (DVB-CI) and/or conditional access (CA). The device 100 may obtain digital content from broadcast signals through an antenna, a tuner, and a demodulator. Alternatively, the device 100 may obtain digital content from an information network, such as the Internet, through a network interface.

A video output unit 162 comprises filters and amplifiers for filtering and amplifying video signals output by the processor 151. An audio output unit 161 comprises a digital to analog converter converting audio signals output by the processor 151 from digital format to analog format.

A display 155 is operable to display text and images, and may comprise e-paper, a display made up of organic light emitting diode (OLED), a field emission display (FED), or a liquid crystal display (LCD). Alternatively, the display 155 may comprise a reflective display, such as an electrophoretic display, an electrofluidic display, or a display using interferometric modulation. The display 155 may display various graphical user interfaces (GUIs) as virtual controls including but not limited to windows, scroll bars, icons, and clipboards. The display 155 may comprise a single display or a plurality of displays in different sizes.

The I/O units 160 comprise a touch sensor 167 operable to detect touch operations on the display 155. The touch sensor 167 may comprise a transparent touch pad overlaid on the display 155 or arrays of optical touch transmitters and receivers located on the boarder of the display 155, such as those disclosed in US patent publication No. 20090189878.

1.2 Embodiments of Main Memory

Nonvolatile memory 153 stores an operating system (OS) and application programs executable by the processor 151. The processor 151 may load runtime processes and data from the nonvolatile memory 153 to the main memory 152 and store digital content in a mass storage device 154. The electronic computing device 100 may obtain digital content such as multimedia data through the communication unit 156. The main memory 152 may comprise a nonvolatile random access memory (NVRAM), such as phase-change random access memory (PRAM), magnetoresistive random access memory (MRAM), Nano-RAM, or other NVRAM. Some examples of NVRAM comprise ferroelectric RAM, resistive RAM, organic bistable memory material, such as those disclosed in U.S. Pat. No. 7,405,167, US patent publication No. 20090146140, or 20090221113. One example of MRAM is spin-transfer torque magnetic random access memory (STT-MRAM). The nonvolatile memory 153 may comprise an electrically erasable programmable read-only memory (EEPROM) or a flash memory, such as a NOR flash or a NAND flash, or an NVRAM. In the following, a PRAM is described as an example of the main memory 152, and a flash memory is described as an example of the nonvolatile memory 153. The example of a PRAM and a flash memory is not intended to limit the disclosed reboot methods and devices. The main memory 152 and the nonvolatile memory 153 may be two logically defined memory areas of an NVRAM unit where the memory area defined as the nonvolatile memory 153 is operable to store the OS intact while the memory area defined as the main memory 152 is operable to be random accessed as the main memory of the processor 151. The NVRAM may electrically connected to the processor 151 through a bus or integrated into the processor 151 as one chip, such as a system on a chip (SOC) or a system in a package (SiP).

A PRAM is a non-volatile memory storing data using chalcogenide materials, such as Germanium-Antimony-Tellurium alloy (Ge—Sb—Te or GST). The crystalline and amorphous states of the phase-change material GST have different electrical resistivity. Phase change between the crystalline and amorphous states may be obtained by temperature control. Under 150° C., both phases are stable. Over 200° C., nucleation of crystallites is fast and if the material is kept to the crystallization temperature for a sufficient time, it changes phase and becomes crystalline. In order to change the phase back to the amorphous state, the chalcogenide temperature is brought over the melting point (about 600° C.) and rapidly reduced.

Figure 3:
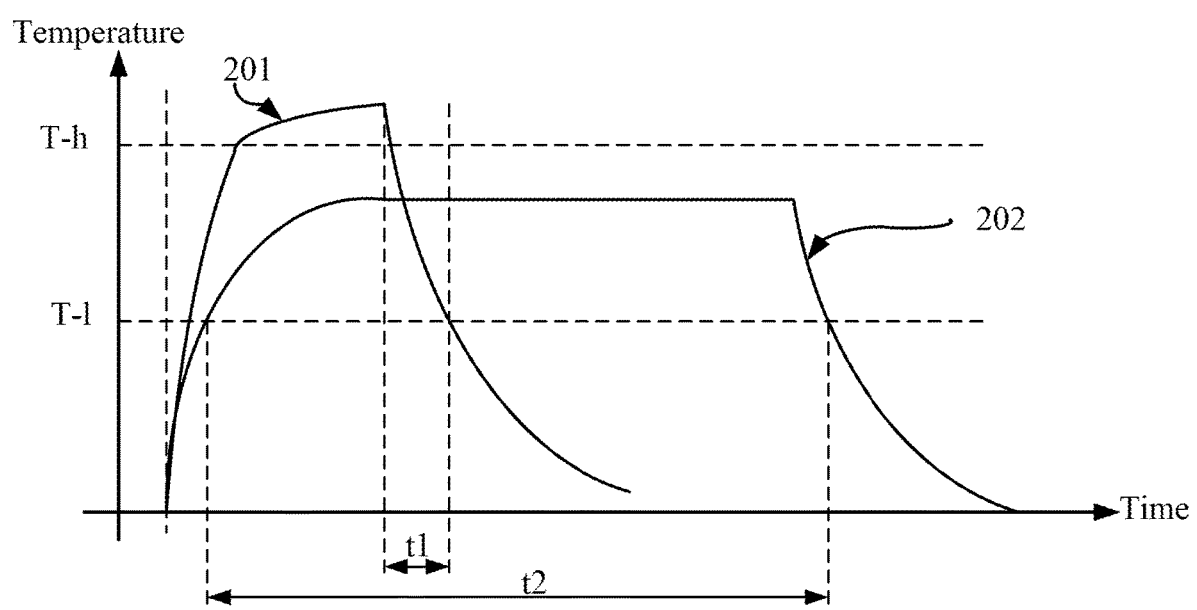
FIG. 3 is a schematic diagram showing a set and reset pulses of an embodiment of a phase change memory element.

FIG. 3 shows the plots of the required temperature versus time to activate phase changes of the phase-change material GST. T-h indicates the melting temperature of the phase-change material GST, and T-l indicates the temperature at which crystallization of the phase-change material GST begins. A curve 201 referred to as a reset pulse shows temperature control for a phase change from the crystalline to the amorphous state, and curve 202 referred to as a set pulse shows temperature control for a phase change from the amorphous to the crystalline state. As shown, amorphization requires a short time but a high temperature heating followed by cooling in a very short time t1. Crystallization requires a long time heating (denoted by duration t2) to allow nucleation and crystal growing.

Figure 4:
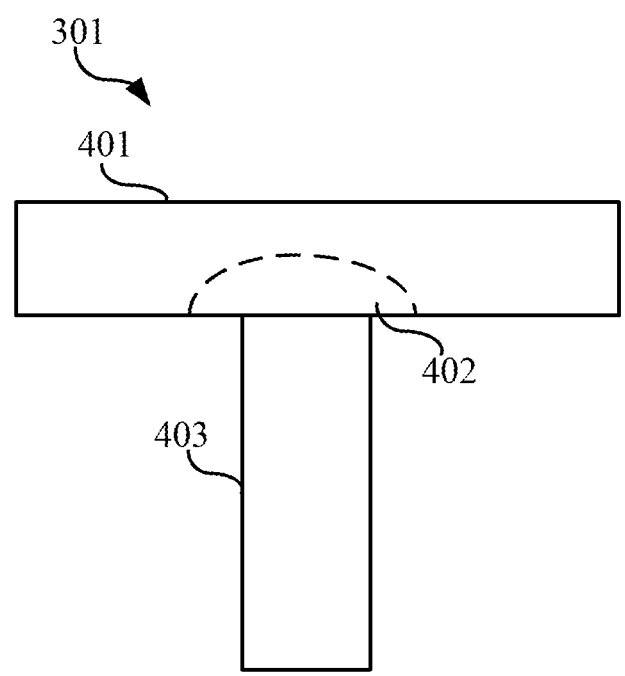
FIG. 4 is a schematic diagram of an embodiment of a cell of a phase change random access memory (PRAM).

FIG. 4 shows a memory device 301 made from the chalcogenide material. A heater 403 comprising a resistive electrode 403 in contact with or close to the chalcogenide material 401 may conduct current and be heated according to Joule effect to carry out the temperature control of set and reset pulses. The chalcogenide material 401 is generally in the crystalline state to allow good current flow. A portion 402 of the chalcogenide material 401 is in direct contact with the heater 403 and forms a phase change portion 402.

The state of the chalcogenide region 402 may be read by applying a sufficiently small voltage so as not to cause a sensible heating and measuring the current passing through it. Since the current is proportional to the conductance of the chalcogenide material, it is possible to discriminate between the two states.

Figure 5:
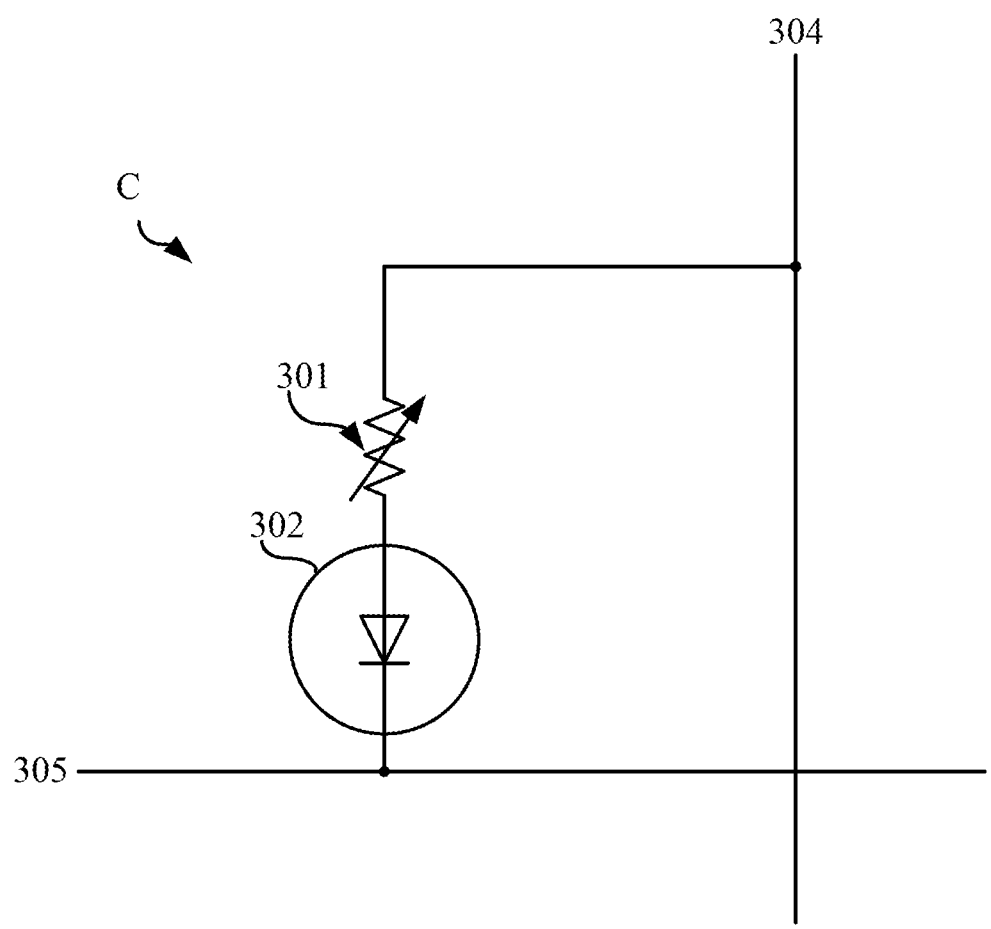
FIG. 5 is a cross section of an embodiment of a memory cell of a PRAM.

FIG. 5 is an equivalent circuit diagram showing a unit cell C of a PRAM. The unit cell C of the PRAM includes the memory device 301 and a diode 302. The diode 302 is a selection element and may be replaced by a transistor. The memory device 301 comprises phase-change material and is connected to a bit line 304 and a P-junction of the diode 302. A word line 305 is connected to an N-junction of the diode 302.

The memory device 301 can be considered as a resistor, which conducts a different current according to its phase. When appropriately biased, the memory device 301 is defined as "set" or "logic 1" in condition of conducting a detectable current, and as "reset", or "logic 0" in condition of not conducting current or conducting a much lower current than a cell that is set.

The main memory 152 may include an array of PRAM cells to provide random access to data stored in the main memory 152.

2. Operations of the Electronic Computing Device

Figure 2:
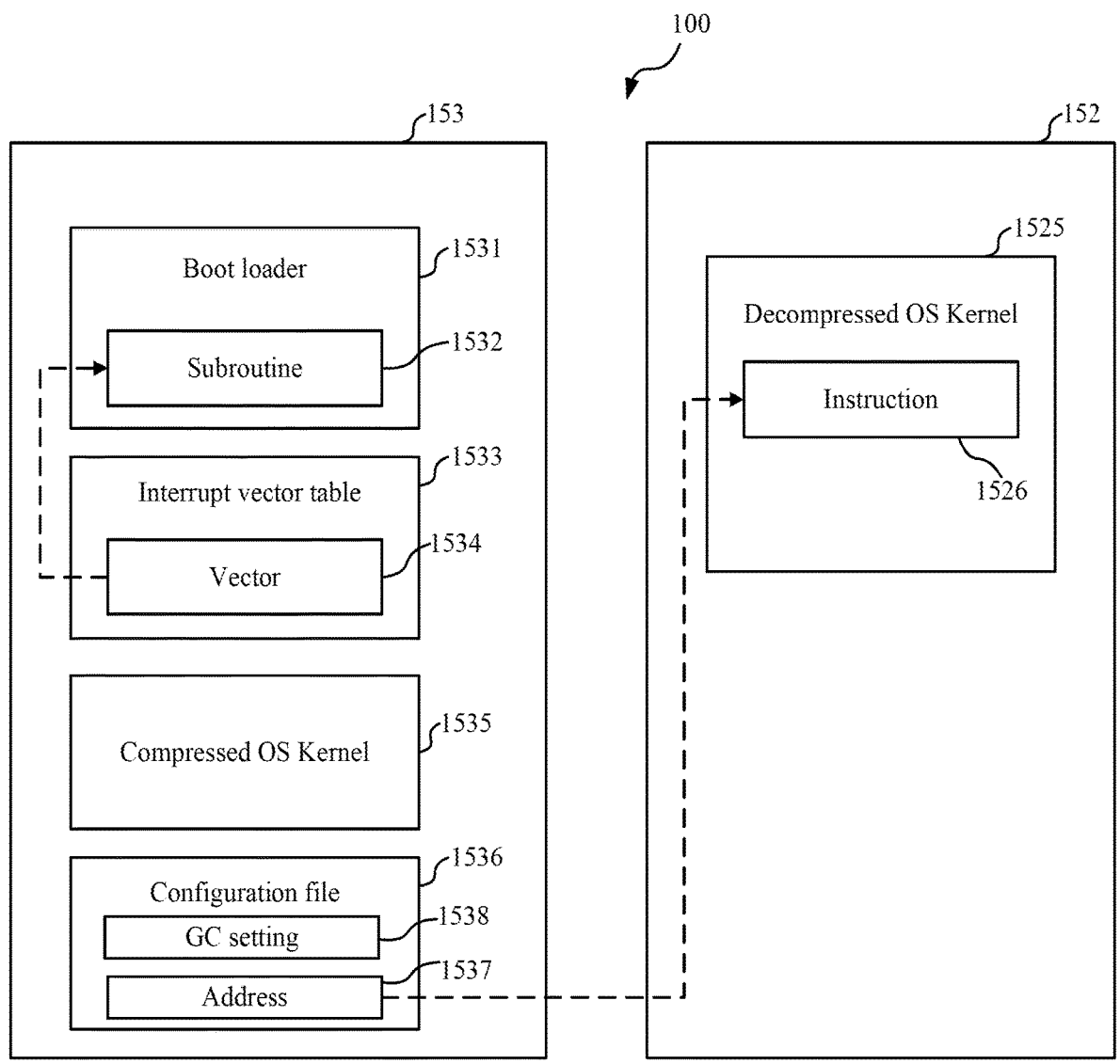
FIG. 2 is a block diagram of an embodiment of memory modules of the electronic computing device.

With reference to FIG. 2, the nonvolatile memory 153 stores a boot loader 1531, a configuration file 1536 thereof, an operating system kernel 1535 in a compressed format, and an interrupt vector table 1533. Note that in alternative embodiments, the nonvolatile memory 153 may store the operating system kernel 1535 in an uncompressed format. A subroutine 1532 in the boot loader 1531 is registered as an interrupt service routine for an interrupt representative of a shutdown or power-off command and is targeted by a vector 1534 in the interrupt vector table 1533. A reboot command may comprise a shutdown command and a subsequent bootstrapping command. The configuration file 1536 further comprises a garbage collection (GC) setting 1538 specifying options of garbage collection processes. The GC setting 1538 may be user adjustable or automatically configured by the processor 151 according to system usage, such as use time from last bootstrapping of the device 100.

When the I/O units 160 receives a depression of a power key of the electronic computing device 100 a representative of a boot or power-on command, the processor 151 executes the boot loader 1531 to perform bootstrapping and initialization and to trigger migration of the kernel 1535 in response to the boot command. Wherein, the migration of the kernel 1535 comprises loading and decompressing thereof from the nonvolatile memory 153 to the main memory 152, to generate kernel 1525 in the main memory 152. The processor 151 executes operations of the OS. The migration of the kernel 1535 in response to the boot command is referred to as a first migration of the kernel 1535. A subroutine in the boot loader 1531 executing the migration of the kernel 1535 may be registered as an interrupt service routine for an interrupt representative of a bootstrapping or power-on command. The bootstrapping comprises clearing of the main memory 152. Note that in alternative embodiments, the nonvolatile memory 153 may store the operating system kernel 1535 in an uncompressed format, so that decompressing of the kernel 1535 is not executed in the migration of the kernel 1535.

2.1 Operations Before Device Shutdown

Figure 6:
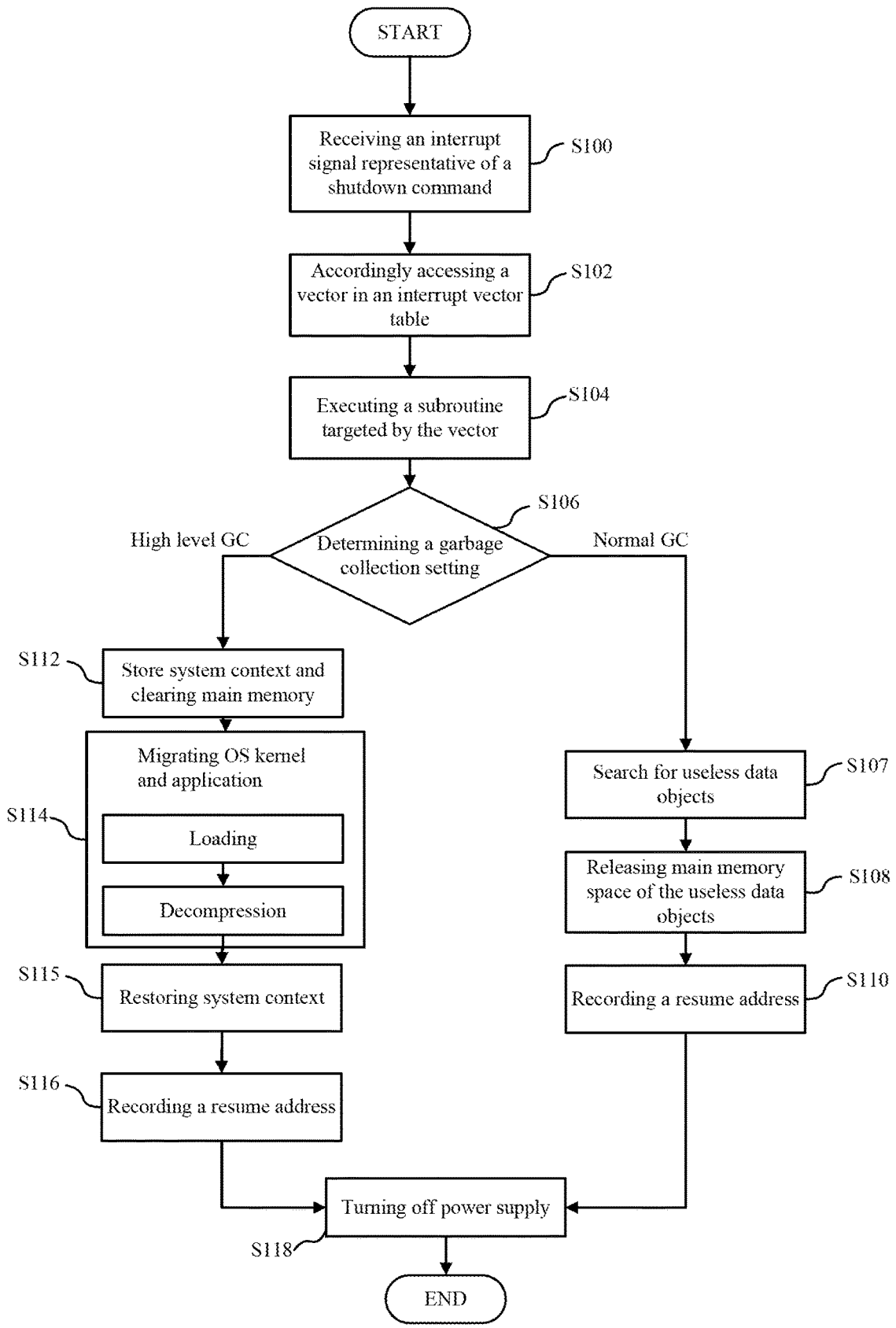
FIG. 6 is a flowchart showing operations of the electronic computing device in response to a shutdown command.

With reference to FIG. 6, during operation of the electronic computing device 100, the I/O units 160 receives depression of a power key of the electronic computing device 100, and issues an interrupt signal representative of a shutdown command to the processor 151 (step S100). The processor 151 performs the following operations in response to the shutdown command. The processor 151 accesses a vector 1534 in the interrupt vector table 1533 corresponding to the interrupt signal (step S102), retrieves and executes a subroutine 1532 targeted by the vector 1534 (step S104). Under direction of the subroutine 1532, the processor 151 may display a shutdown message or disable video signal output, and performs one of a plurality of levels of garbage collection (GC) detailed in the following according to a GC setting. The GC setting is a memory releasing setting indicating one of a plurality of memory processes.

The processor 151 determines a GC setting 1538 in a configuration file 1536 (step S106). In response to a GC setting indicative of normal garbage collection, the processor 151 searches the main memory 152 for data objects that cannot be accessed by other programs in the device 100 (step S107) and releases space of the main memory 152 occupied by these objects (step S108). The processor 151 records an address 1537 of the main memory 152 from which execution of the kernel 1535 is designated to resume (step S110) and triggers the device 100 to power off (step S118). An old version of kernel 1525 is retained in the main memory 152 through the steps S107, S108, S110, and S118. The steps S107 and S108 form one of the plurality of memory processes.

In response to a GC setting indicative of high level garbage collection, the processor 151 stores system context to the nonvolatile memory 153, clears the main memory 152 (step S112), triggers a further migration of the kernel 1535 and application programs from the nonvolatile memory 153 to the main memory 152 according to the stored system context (step S114), and restores system context (step S115). The clearing of the main memory 152 comprises deleting all data in the main memory 152. A new version of kernel 1525 is retained in the main memory 152 through the steps S112, S114, S115, and S118. The migration of the kernel 1535 in response to the shutdown command is referred to as a second migration and comprises loading and decompressing of the compressed kernel 1535 from the nonvolatile memory 153 to the main memory 152. Similarly, the migration of the application programs comprises loading and decompressing thereof from the nonvolatile memory 153 to the main memory 152. The system context comprises hardware component configurations, page tables, process management data, process data structure of the application programs, and other system settings. In step S115, the processor 151 may restore a portion of the system context, for example, a portion thereof to the main memory 152. The remaining portions of the system context may be restored during subsequent bootstrapping of the device 100. Data and program distribution in the main memory 152 is rearranged through the step S114. In alternative embodiments of the device 100, a new version of kernel 1525 may be retained in the main memory 152 through shutdown of the device 100 by reloading triggers a migration of the kernel 1535 without restoring the system context. The step S112 forms another one of the plurality of memory processes. The processor 151 records an address 1537 of the main memory 152 from which execution of the kernel 1535 is designated to resume in response to reboot of the electronic computing device 100 (step S116) and triggers the device 100 to power off (step S118). For example, the processor 151 turns off the power supply 158.

The clearing of the main memory 152 and the migration of the kernel 1535 is a portion of normal bootstrapping of the device 100. Through the execution of steps S112 and S114, the processor 151 performs a portion of the bootstrapping of the device 100 in response to the shutdown command before actually shutting down the device 100. The processor 151 may rearrange utilization of the main memory 152 after the migration of the kernel 1535 and other application programs before actually shutting down the device 100. Alternatively, in step S114, the processor 151 may only trigger migration of the kernel 1535. The processor 151 may disable other interrupt handling for any subsequent interrupt during execution of the steps S107, S108, S110, S112, S114, S115, and S116 and render these steps non-interruptible.

2.2 Operations During Device Bootstrapping

Figure 7:
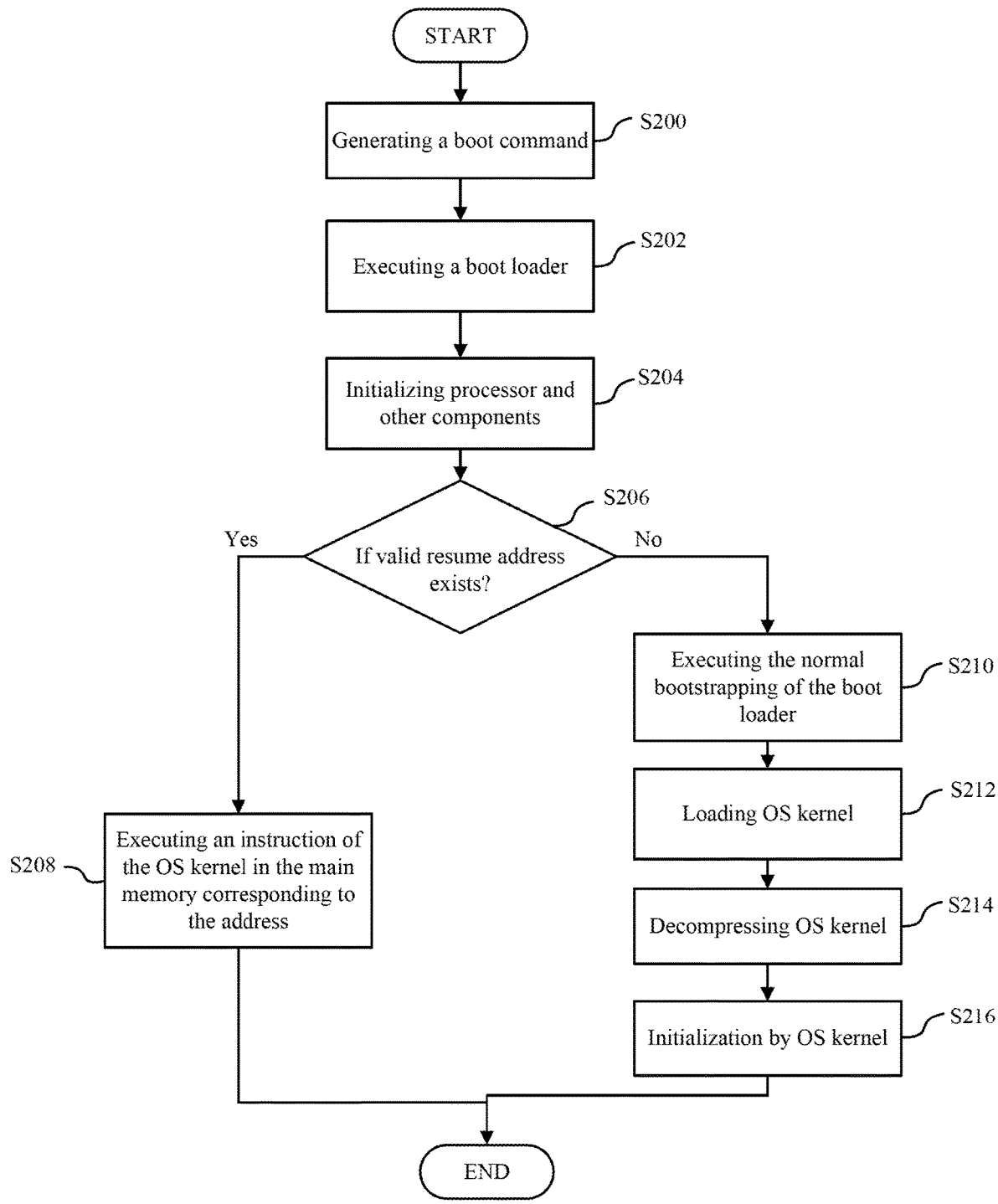
FIG. 7 is a flowchart showing operations of the electronic computing device in response to a boot command.

With reference to FIG. 7, during power off state of the electronic computing device 100, depression of the power key of the electronic computing device 100 triggers a boot command to the processor 151 (step S200). The processor 151 performs the following operations in response to the boot command.

When receiving the boot command from the input unit, the processor 151 executes the boot loader 1531 (step S202). The processor 151 may perform one of the plurality of memory leasing processes based on a bootstrap-related field. For example, the bootstrap-related field may comprise the configuration file 1536 which comprises the resume address 1537. The boot loader 1531 directs initialization of the processor 151 and other components of the device 100 (step S204), and directs the processor 151 to determine if a valid resume address exists (step S206). When determining that the valid resume address 1537 exists, the processor 151 retrieves the stored resume address 1537 and executes an instruction 1526 of the kernel 1525 in the main memory 152 corresponding to the address 1537 (step S208). A dotted arrow in FIG. 2 shows relationship between the address 1537 and the instruction 1526. Thus, the processor 151 switches execution to the address 1537 of the main memory 152. Clearing of the main memory 152 and the migration of the kernel 1535 and application programs after the boot command is not performed, thus reducing time required for rebooting the device 100.

When determining that the valid resume address 1537 does not exist, the processor 151 executes the normal bootstrapping by executing the boot loader 1531 (step S210), loads and decompresses the OS kernel 1535 to generate the OS kernel 1525 (steps S212 and S214), and performs other system initialization under direction of the OS kernel 1525 (step S216). The bootstrapping in step S210 comprises clearing of the main memory 152.

3 Variations

In some embodiments of the reboot method, the processor 151 may not perform memory releasing during the shutdown process. The processor 151 may perform one of the plurality of memory leasing processes during bootstrapping based on an instance of the bootstrap-related field. The instance of the bootstrap-related field may be user-adjustable or automatically configured by the processor 151 according to system usage, such as use time from last bootstrapping of the device 100.

Figure 8:
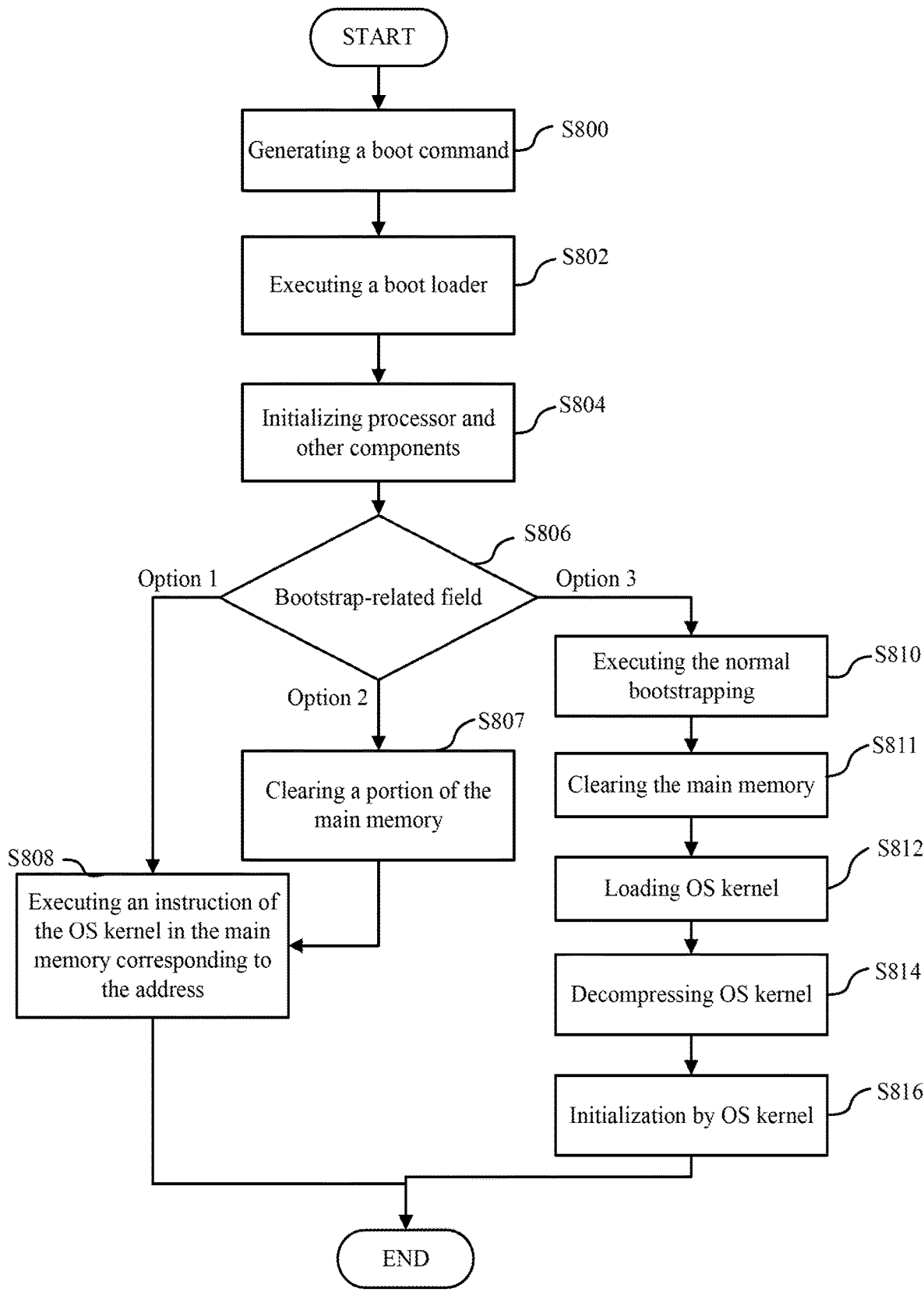
FIG. 8 is a flowchart showing alternative operations of the electronic computing device in response to a boot command.

With reference to FIG. 8, during power off state of the electronic computing device 100, depression of the power key of the electronic computing device 100 triggers a boot command to the processor 151 (step S800). The processor 151 performs the following operations in response to the boot command.

When receiving the boot command from the input unit, the processor 151 executes the boot loader 1531 (step S802). The boot loader 1531 directs initialization of the processor 151 and other components of the device 100 (step S804), and directs the processor 151 to determine the instance of the bootstrap-related field (step S806). When determining that the instance of the bootstrap-related field represents a first option of a plurality of bootstrapping sequences, the processor 151 retrieves the stored resume address 1537 and executes an instruction 1526 of the kernel 1525 in the main memory 152 corresponding to the address 1537 (step S808). A dotted arrow in FIG. 2 shows relationship between the address 1537 and the instruction 1526. Thus, the processor 151 switches execution to the address 1537 of the main memory 152. Clearing of the main memory 152 and the migration of the kernel 1535 and application programs after the boot command is not performed, thus reducing time required for rebooting the device 100.

When determining that the instance of the bootstrap-related field represents a second option of the plurality of bootstrapping sequences, the processor 151 clears a portion of the main memory 152 (step S807), retrieves the stored resume address 1537 and executes an instruction 1526 of the kernel 1525 in the main memory 152 corresponding to the address 1537 (step S808), and switches execution to the address 1537 of the main memory 152. The second option of the plurality of bootstrapping sequences executes a partial memory releasing process through step S807. In some embodiments of the reboot method, the boot loader 1531 may direct the memory releasing processes. In some alternative embodiments of the reboot method, step S811 may be placed after step S808, so that the kernel 1525 may direct the memory releasing processes.

When determining that the instance of the bootstrap-related field represents a third option of the plurality of bootstrapping sequences, the processor 151 executes the normal bootstrapping by executing the boot loader 1531 (step S810), clearing the main memory 152 (step S811), loading and decompressing the OS kernel 1535 to generate the OS kernel 1525 (steps S812 and S814), and performs other system initialization under direction of the OS kernel 1525 (step S816). The third option of the plurality of bootstrapping sequences executes a complete memory releasing process by clear entire main memory 152 in step S811.

Table 1 shows embodiments A to I of the device 100 executing a reboot method. Each embodiment of the device 100 executes an embodiment of the reboot method includes a shutdown process and a bootstrapping process subsequent to the shutdown process. The embodiments of the device 100 may be implemented in different devices or in one device that provides options of executing reboot methods in some or all of the embodiments A to I. Each embodiment of the device 100 may utilize a semaphore to avoid a memory releasing process or an OS reloading process in the shutdown process being faultily repeated in a subsequent bootstrapping process or being erroneously missed. An example of the semaphore may be the bootstrap-related field. In the embodiments F, G, H, and I, the normal bootstrapping may be executed in response to a user operation, or an event of system statistics. The normal bootstrapping includes clearing the main memory 152 and a migration of the OS kernel 1535. The processor 151 may detect the user operation and determine whether to enforce the clearing the main memory 152 and the migration of the OS kernel 1535 regardless of the content and status of the main memory 152. The user operation may be a key press, a key combination, or a selection of a GUI element. The user operation may take place and be detected before or during bootstrapping. A setting reflecting the user operation can be stored in a memory of the device 100. When receiving the user operation, the processor 151 enforces the clearing the main memory 152 and the migration of the OS kernel 1535 regardless of the content and status of the main memory 152.

TABLE 1

|  | Shutdown process | Bootstrapping process |
| --- | --- | --- |
| Embodiment A | Retaining OS and resume address | Bypassing NVRAM clearing and OS reloading Resuming OS |
| Embodiment B | Retaining OS and resume address | Partially releasing NVRAM Resuming OS |
| Embodiment C | Partially releasing NVRAM Retaining OS and resume address | Bypassing NVRAM clearing and OS reloading Resuming OS |
| Embodiment D | Clearing NVRAM Reloading OS Retaining OS and resume address | Bypassing NVRAM clearing and OS reloading Resuming OS |
| Embodiment E | Clearing NVRAM | Bypassing NVRAM clearing Reloading OS |
| Embodiment F | Retaining OS and resume address | Normal bootstrapping |
| Embodiment G | Partially releasing NVRAM Retaining OS and resume address | Normal bootstrapping |
| Embodiment H | Clearing NVRAM | Normal bootstrapping |
| Embodiment I | Clearing NVRAM Reloading OS Retaining OS and resume address | Normal bootstrapping |

In the embodiments shown in table 1, retaining OS and resume address may be retaining a new version or an old version of the kernel 1525 in the main memory 152 and storing a resume address of the retained version of the kernel 1525 in a storage device or a non-volatile memory. Additionally, resuming OS comprises resuming execution of the OS kernel 1525 utilizing the resume address.

NVRAM may be a key enabler to the rise of machine to machine (M2M) communication, and Internet of things (IoT) because the number of M2M devices is expected to reach three billions in 2024 and power efficiency is critical to M2M devices. Machine to machine (M2M) communication sometimes are named as machine type communication (MTC) and may comprise device to device (D2D) communication, and vehicle to vehicle (V2V) communication. Vehicle-to-vehicle communication (V2V communication) is the wireless transmission of data between motor vehicles. The goal of V2V communication is to prevent accidents by allowing vehicles in transit to send position and speed data to one another over an ad hoc mesh network.

Embodiments of the device 100 utilizing NVRAM for power saving is provided in the following. An embodiment of the device 100 may comprise a plurality of power saving states, and one of the power saving states utilizing a non-volatile random access memory to cache chipset context of the UE device 100. NVRAM may serve as registers in an arithmetic logic units (ALUs) or main memory to cache the chipset context in a power saving state.

Figure 9:
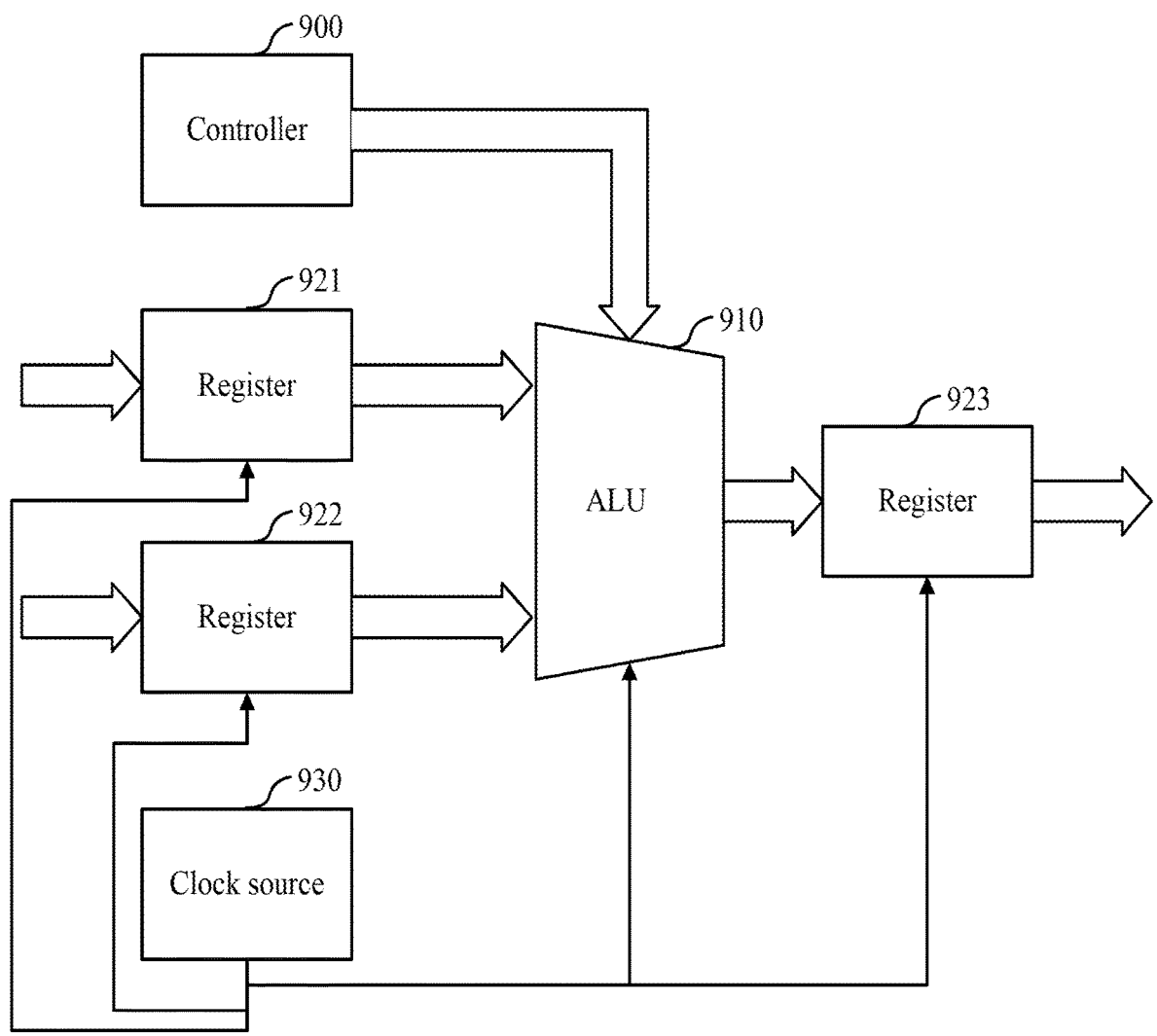
FIG. 9 is a schematic diagram of an embodiment of arithmetic logic units (ALU) of a processor.

With reference to FIG. 9, the processor 151 may be formed from one or more ALUs 910 utilizing NVRAM as register memory and cache memory. Registers 921, 922, and 923 are made from NVRAM. A clock source 930 provides clock signals to the ALU 910, and the registers 921, 922, and 923. Registers 921 and 922 respectively store and provide different operands to ALU 910 which executes an arithmetic or logic operation on the operands according to control signals from a controller 900. The arithmetic or logic operation can be one of arithmetic addition, multiplication, bit shifting, and other operations according to the control signals. The controller 900 decodes instructions based on an instruction set and generates the control signal and the operands from the decoded instructions. The ALU 910 outputs result of the arithmetic or logic operation to register 923. Buses and connections for transmitting clock signals, the operands, the output data, and the control signals are shown as arrows in FIG. 9. Data can be provided through an input bus to each of the registers 921 and 922 to update operands. Data in the register 923 can be output to another memory device or component in the processor 151.

The processor 151 may transit from a working state to a sleep state or a low power consumption state in response to a power saving command without storing the whole chipset context of the processor 151 to a storage device, and may restore to the working state from the sleep state or the low power consumption state in response to a wake-up command without restoring the whole chipset context of the processor 151 from a storage device. The whole chipset context of the processor 151 may be retained in the chip of the processor 151, such as in the register memory and the cache memory made up of NVRAM during the sleep state or a low power consumption state. State transition of the processor 151 can be done in a short time if the state transition is executed by retaining chipset context of the processor 151 in the register of the processor 151, and storing the whole chipset context of the processor 151 to a storage device and restoring of the chipset context are not required during state transition.

The power saving command and the wake-up command may be transmitted through the controller 900. The ALU 910 may respond to the power saving command in a clock cycle i by suspending an operation in a clock cycle i+j and transiting from a working state to a sleep state and, wherein i and j are integer variables, and j may be one or more than one. The ALU 910 may respond to the wake-up command in a clock cycle i+n by transiting from the sleep state to the working state and executing the operation suspended in the clock cycle i+j, wherein n is another integer variable. The ALU 910 provides the operation suspending mechanism and operation resume mechanism, and the kernel 1525 may perform a preparation process before issuing an instance of the power saving command and the transition of the ALU 910 to the sleep state. The preparation process comprises shutting down components of the device 100.

A first communication device and a second communication device may carry intermittent connectivity communication according to a schedule. The intermittent connectivity communication may be for communication of control signal or data transmission, or for synchronization. For example the first communication device may transmit the schedule to the second communication device. The processor 151 decodes the schedule and converts the schedule to a power state transition plan. A timer, such as one of the timer 50 and 60 may cause the controller 900 to deliver the power saving command and the wake-up command to the processor 151 according to the power state transition plan. The timer may keep working on delivery of the power saving command and the wake-up command regardless of the state of the ALU 910.

The first communication device and the second communication device may be two embodiments of the device 100 and may exclude some components of the device 100, such as the display, touch panel, media playback related components, and others. The first communication device and the second communication device may communicate in a machine to machine (M2M) mode or in a server to client mode. Each of the first communication device and the second communication device may begin communication to each other in the working states and stop communication in the sleep state. For example, the first communication device may be a base station, and the second communication device may be a mobile station.

In a condition that the device 100 functions as a mobile terminal, the communication unit 156 comprises a decoder operable to decode superposition coding and non-coherent multi-user (MU) multiple input multiple output (MIMO) coding. In a condition that the device 100 functions as a base station or an access point, the communication unit 156 comprises an encoder operable to encode superposition coding and non-coherent multi-user (MU) multiple-input multiple-output (MIMO) coding. The superposition coding is a multiplexing scheme which multiplies signals $x_1$, $x_2$, ... $x_K$ to multi-user terminals from 1 to K by power sharing factors $\gamma_1$, $\gamma_2$, ... $\gamma_K$, where K is the number of terminals, and summation of the power sharing factors $\gamma_1$, $\gamma_2$, ... $\gamma_K$ equals to one. The non-coherent MU-MIMO coding may be based on differential unitary space-time modulation (DUSTM) constellations or Grassmannian constellations (GC). Applying superposition coding to non-coherent MIMO coding reduces complexity of MU-MIMO downlink detection as disclosed by IEEE SIGNAL PROCESSING LETTER, VOL 21, No. 10, October 2014, entitled "Multi-User Non-Coherent Detection for Downlink MIMO Communication." The first communication device may determine a power dispatching plan and dispatch the power sharing factors $\gamma_1, \gamma_2, \ldots \gamma_K$ to K terminals including the second communication device according to the power dispatching plan. For example, if a power sharing factor $\gamma_m$ is dispatched to terminal m, the first communication device multiplies the signal $x_m$ transmitted to terminal m by the power sharing factor $\gamma_m$ and a power value P to generate $P \cdot \gamma_m \cdot x_m$ where m is an integer variable and $1 \leq m \leq K$. If a power sharing factor $\gamma_{m+1}$ is dispatched to terminal m+1, the first communication device multiplies the signal $x_{m+1}$ transmitted to terminal m+1 by the power sharing factor $\gamma_{m+1}$ and a power value P to generate $P \cdot \gamma_{m+1} \cdot x_{m+1}$. The K terminals perform successive interference cancellation and downlink non-coherent MIMO signal detection according to the power dispatching plan. If $\gamma_1 > \gamma_2 > \ldots \gamma_m > \gamma_{m+1} > \gamma_{m+2} > \ldots \gamma_K$, the terminal m performs successive interference cancellation prior to the terminal m+1, and terminal m+1 performs successive interference cancellation prior to the terminal m+2 with the power sharing factors $\gamma_{m+2}$. The terminals 1 to K may be embodiments of the device 100.

Let $Y_m = W_m + X_m \cdot H_m$ be the received signal of terminal m, where $W_m = W_{m+1} + X_{m+1} \cdot H_{m+1}$. $W_m$ is the noise in $Y_m$. $H_m$ is a channel matrix for terminal m. $X_m = P \cdot \gamma_m \cdot x_m$. Let $Y_{m+1} = W_{m+1} + X_{m+1} \cdot H_{m+1} + X_m \cdot H_m$ be the received signal of terminal m+1, where $W_{m+1} = W_{m+2} + X_{m+2} \cdot H_{m+2}$. $W_{m+1}$ is the noise in $Y_{m+1}$. $H_{m+1}$ is a channel matrix for terminal m+1. $X_{m+1} = P \cdot \gamma_{m+1} \cdot x_{m+1}$. Let $Y_{m+2} = W_{m+2} + X_{m+2} \cdot H_{m+2} + X_{m+1} \cdot H_{m+1} + X_m \cdot H_m$ be the received signal of terminal m+2, where $W_{m+2} = W_{m+3} + X_{m+3} \cdot H_{m+3}$. $W_{m+2}$ is the noise in $Y_{m+2}$. $H_{m+2}$ is a channel matrix for terminal m+2. $X_{m+2} = P \cdot \gamma_{m+2} \cdot x_m + 2$.

The terminal m once completing successive interference cancellation to obtain processed signal $X_m \cdot H_m$ can transmit the processed signal $X_m \cdot H_m$ to the terminal m+1, so that the terminal m+1 can obtain signal $W_{m+1} + X_{m+1} \cdot H_{m+1}$ by subtracting the processed signal $X_m \cdot H_m$ from $Y_{m+1}$. Similarly, the terminal m+1 once completing successive interference cancellation to obtain processed signal $X_{m+1} \cdot H_{m+1}$ can transmit the processed signal $X_{m+1} \cdot H_{m+1}$ to the terminal m+2, so that the terminal m+2 can obtain signal $W_{m+2} + X_{m+2} \cdot H_{m+2}$ by subtracting the processed signals $X_m \cdot H_m$ and $X_{m+1} \cdot H_{m+1}$ from $Y_{m+2}$.

In an embodiment where the device 100 functions as a relay user equipment (UE) device, the relay UE executes a capability discovery method. An example of the relay UE capable of exposing usage type of the relay UE is disclosed in US 20160044651A1. Usage type is a field defined in 3GPP TR 23.799 V14.0.0 and TR23.707 utilized for selection of network slice instances (NSIs) and dedicated core networks (DCNs). 3GPP TR 23.799 V14.0.0 discloses network slicing issue and solutions. Control plane (CP) of the next generation (NextGen) core network comprises three types of network functions (NFs): slice selection function (SSF), common CP NF (CCNF), and slice specific CP NF (SSNF). The SSF handles the UE's initial attach request and new session establishment request by selecting an appropriate network slice instance for the UE based on the UE's subscription information, UE usage type, service type and UE capabilities. The SSF is not specific to a particular network slice instance. The Common CP NF is the CP entry function, which at least includes the mobility management (MM) function, authentication (AU) function, and non-access stratum (NAS) proxy function. The common CP is shared among different slices. Slice specific CP NF is the NFs which are located on the non-shared slice parts, such as session management (SM) NF. Each NSI may be associated with a physical radio access network (RAN) or a RAN slice instance. Each network slice instance associated with a network slice type identifier (NeS-ID). The NeS-ID is used to identify the type of the slice.

A network slice instance (NSI) may be an instance created from a network slice template (NST). A NST is a logical representation of the network function(s) and corresponding resource requirements necessary to provide the required telecommunication services and network capabilities requested by a UE associated with subscription and service type. Network capability is a network provided and 3GPP specified feature that typically is used as a component that may be combined into a telecommunication service that is offered to an "end user". Location service, group broadcast/multicast, session management, network capability exposure are examples of network capability. Network and UE capabilities may be used network internally and/or can be exposed to external users, which are also denoted as 3rd parties.

A network function is a 3GPP adopted or 3GPP defined processing function in a network, which has defined functional behavior and 3GPP defined interfaces. A network function can be implemented either as a network element on a dedicated hardware, or as a software instance running on a dedicated hardware, or as a virtualized function instantiated on an appropriate platform, such as on a cloud infrastructure.

Figure 10A:
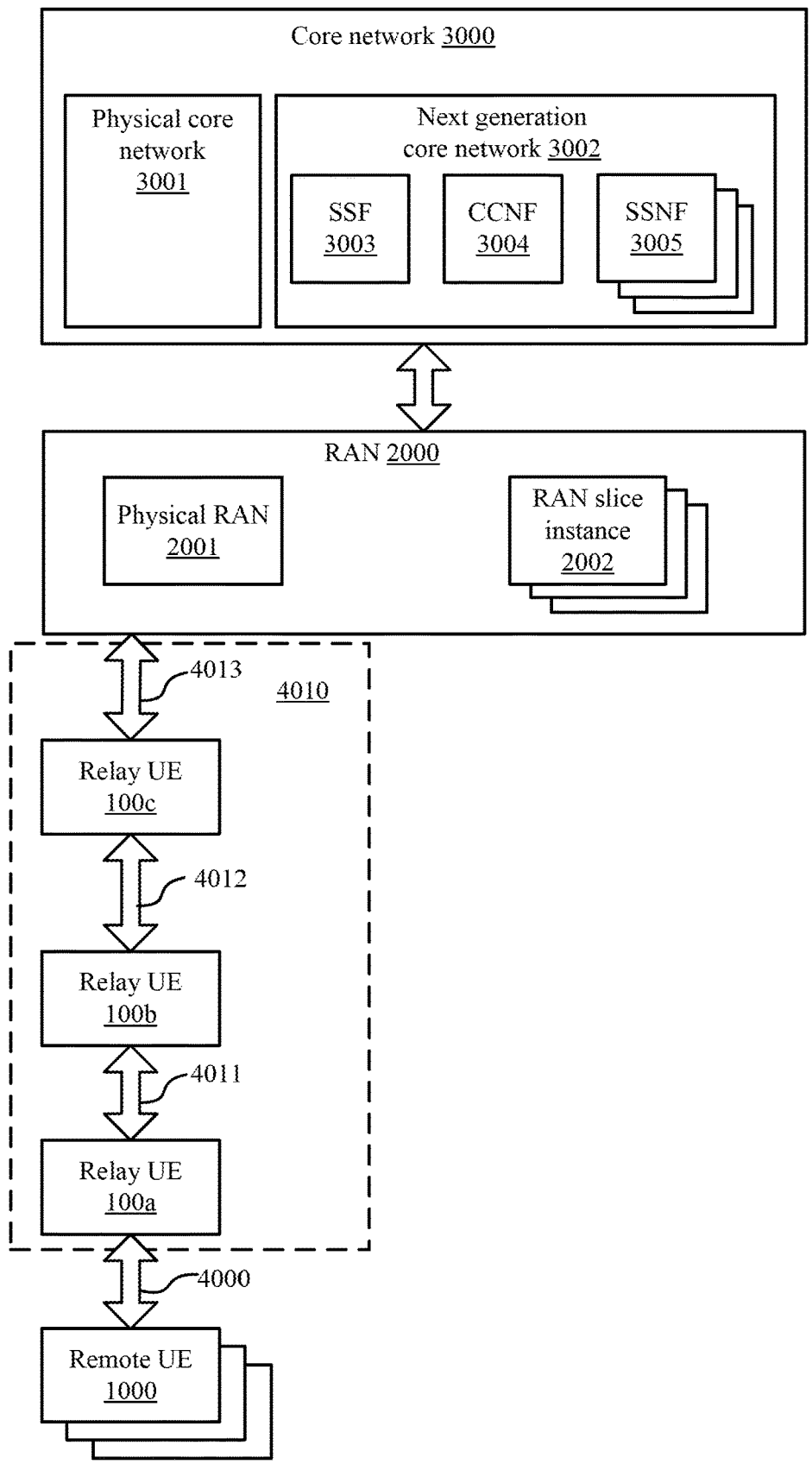
FIG. 10A shows an embodiment of a relay user equipment (UE) device with a multi-hop wireless backhaul connection.
Figure 10B:
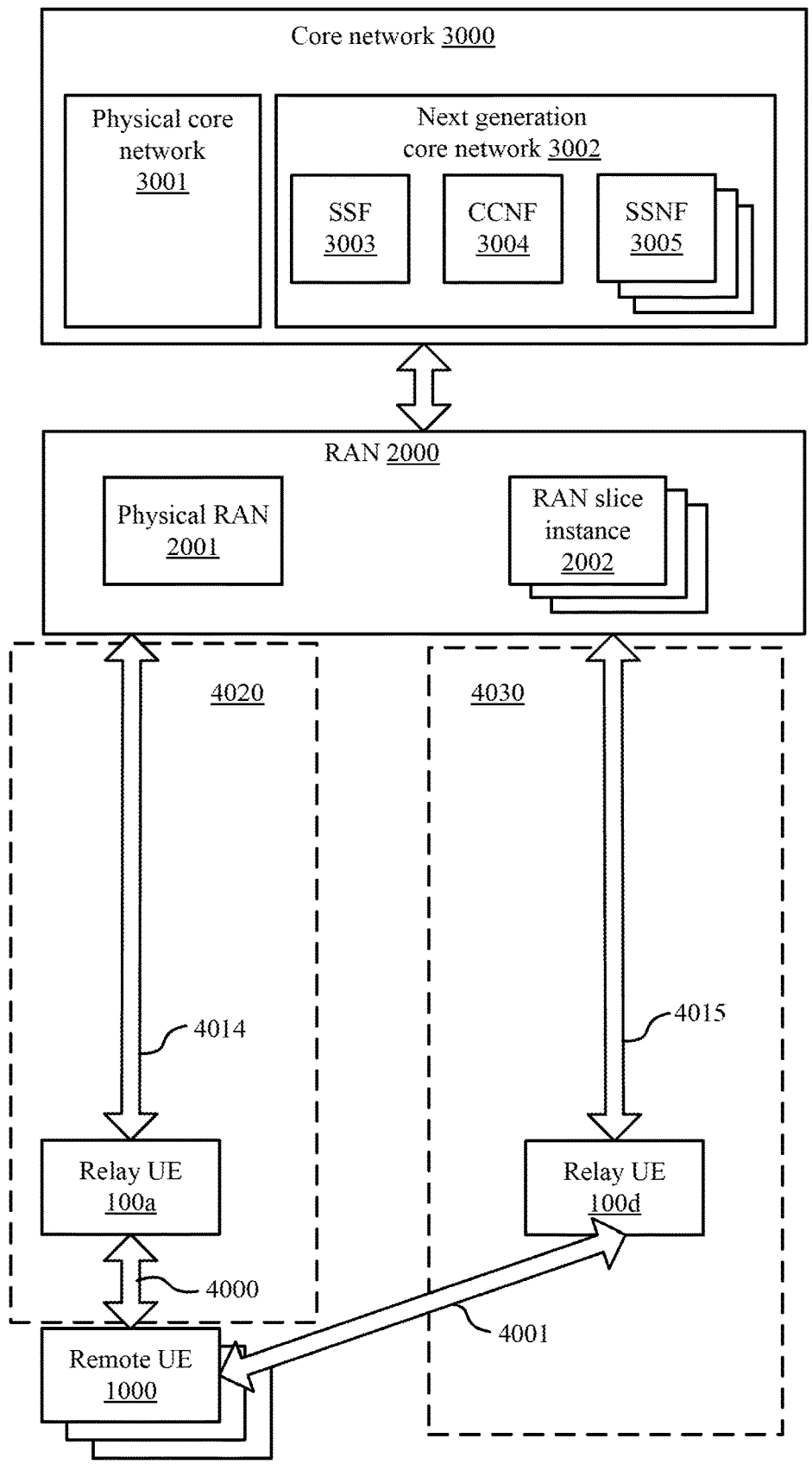
FIG. 10B shows an embodiment of a relay UE device with topologically redundant wireless backhaul connections.
Figure 10C:
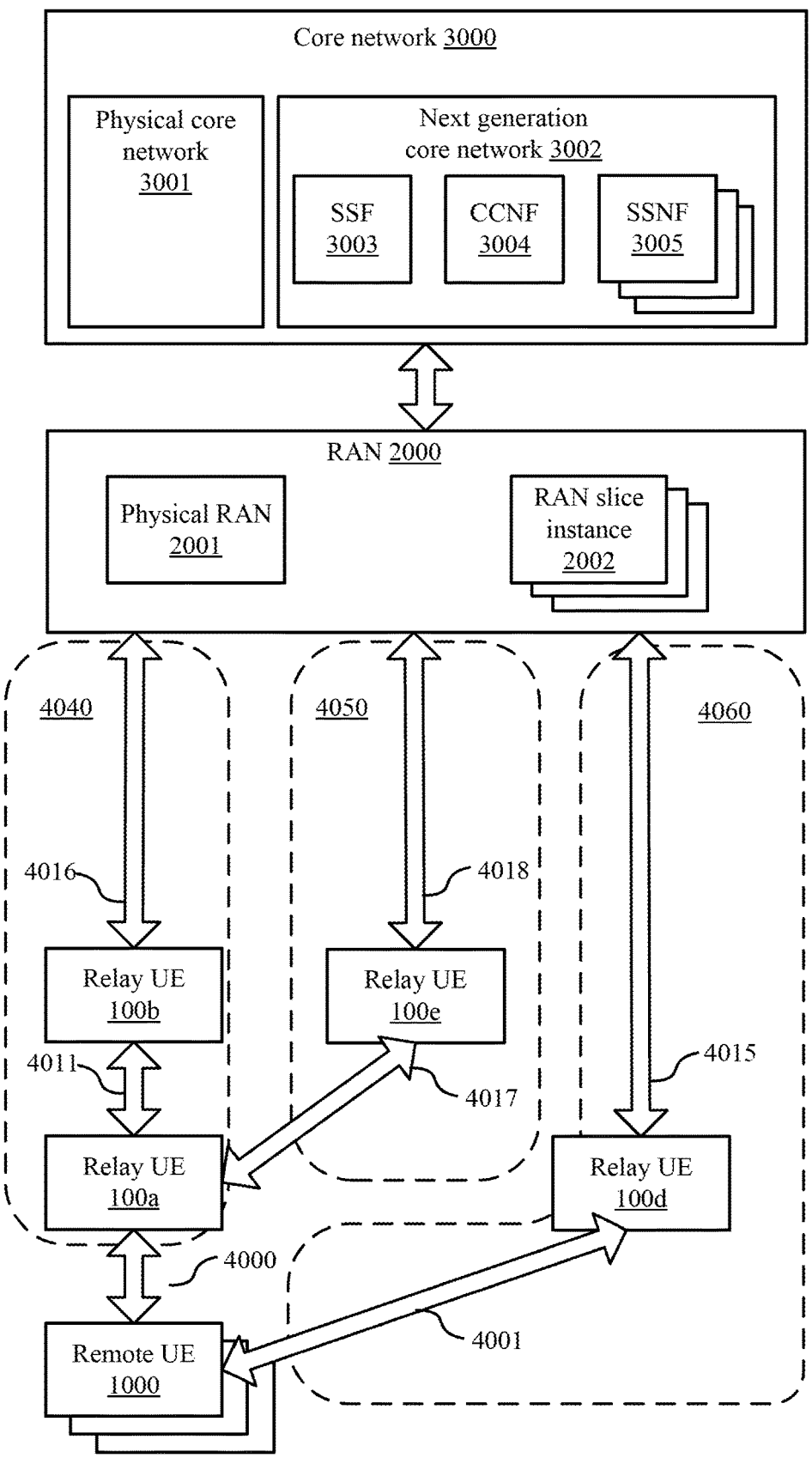
FIG. 10C shows an embodiment of a relay UE device with a multi-hop wireless backhaul connection and topologically redundant wireless backhaul connections.

FIGS. 10A-10C show embodiments of the relay UE device. Relay UE devices 100a, 100b, 100c, 100d, and 100e may be embodiments of the device 100. Each of connections 4000, 4001, 4011, 4012, 4013, 4014, 4015, 4016, 4017, 4018, 4020, 4030, 4040, 4050, and 4060 may comprise one or more 3GPP or non-3GPP wireless channels connecting two entities shown in FIGS. 10A-10C.

With reference to FIG. 10A, a set of core networks 3000 comprises at least one physical core network 3001 and a next generation core network 3002. The next generation core network 3002 comprises a SSF 3003, CCNF 3004, and a plurality of SSNFs 3005. The set of core networks 3000 are connected to a RAN 2000 comprising a physical RAN 2001 and a plurality of RAN slice instances 2002. A remote UE 1000 connects to the core networks 3000 through connection 4000, the relay UE 100a, connection 4011, the relay UE 100b, connection 4012, the relay UE 100c, connection 4013, and the RAN 2000. The remote UE 1000 may be an IoT device, a wearable device, a mobile phone, and/or an embodiment of the device 100. The relay UE 100a may provide wireless local connections to a plurality of remote UE devices. A plurality of additional relay devices or AP devices, such as the relay UE devices 100b and 100c may be utilized to support multi-hop wireless self-backhauling for the wireless backhaul connection of the relay UE device 100a. For example, the relay UE device 100a may connect to an eNB, a RAN, or a network slice of the RAN 2000 though a multi-hop wireless backhaul connection 4010 which comprises the connections 4011, 4012, and 4013. As the number of relay UE devices increases in the multi-hop wireless backhaul connection 4010, communication latency may also increase, and thus may not meet the URLLC service type.

With reference to FIG. 10B, one or more additional relay devices or AP devices, such as the relay UE device 100d may be utilized to provide topological redundant wireless backhaul connections for the remote UE 1000. For example, the remote UE 1000 may simultaneously connect to an eNB, a RAN, or a network slice of the RAN 2000, or two entities in the RAN 2000 though connection 4020 and connection 4030. One of the connections 4020 and 4030 is a primary backhaul path, and the other is a secondary backhaul path. The connection 4020 comprises connection 4000 and 4014. The connection 4030 comprises connection 4001 and 4015. The remote UE 1000 may utilize the connections 4020 and 4030 to aggregate radio resources, such as using carrier aggregation (CA), into a greater bandwidth logical channel or utilize the connections 4020 and 4030 as multi-connectivity channels. Mainly, the remote UE 1000 may aggregate radio resources of the connections 4020 and 4030 to increase bandwidth of the wireless communication between the remote UE 1000 and the RAN 2000. Alternative, the remote UE 1000 may utilize the connections 4020 and 4030 as multi-connectivity channels to increase reliability of the wireless communication between the remote UE 1000 and the RAN 2000. The remote UE 1000 may duplicate a control plane packet or a user plane data packet to generate at least two copies of the packet and transmit one copy of the duplicated packet through the connection 4020 and the other copy of the duplicated packet through the connection 4030, thus to enhance reliability of the wireless communication between the remote UE 1000 and the RAN 2000. A relay UE may obtain information reflecting whether the relay UE is utilized to the radio resource aggregation or the multi-connectivity channels to meet service requirement of the remote UE 1000. In a condition that the relay UE devices are network controllable, such as configurable by a core network entity or a RAN entity, a network entity may configure the relay UE devices for the multi-hop wireless backhaul connection, or the topologically redundant wireless backhaul connections for the radio resource aggregation or the multi-connectivity channels. A relay UE may obtain information reflecting whether the relay UE device are utilized for the multi-hop wireless backhaul connection, or the topologically redundant wireless backhaul connections for the radio resource aggregation or the multi-connectivity channels. A relay UE may be thus configured to meet different UE service requirements. The service requirement may comprise at least one or more of service type, UE subscription, RAN slice instance ID, core network slice instance ID, and UE usage type.

With reference to FIG. 10C, one or more additional relay devices or AP devices, such as the relay UE device 100e may be utilized to provide topological redundant wireless backhaul connections for the relay UE device 100a. For example, the remote UE 1000 may simultaneously connect to an eNB, a RAN, or a network slice of the RAN 2000, or two or more entities in the RAN 2000 though connections 4040, 4050, and 4060. One of the connections 4040, 4050, and 4060 is a primary backhaul path, and the others are secondary backhaul paths. The connection 4040 comprises connection 4011 and 4016. The connection 4050 comprises connection 4017 and 4018. The connection 4060 comprises connection 4001 and 4015. The remote UE 1000 may utilize the connections 4040, 4050, and 4060 to aggregate radio resources, such as using CA, into a greater bandwidth logical channel or utilize the connections 4040, 4050, and 4060 as multi-connectivity channels. Similarly, the relay UE 100a may utilize the connections 4040 and 4050 to aggregate radio resources, such as using CA, into a greater bandwidth logical channel or utilize the connections 4040 and 4050 as multi-connectivity channels. A relay UE may be utilized to aggregate radio resources to increase bandwidth to meet eMBB service type.

Figure 11:
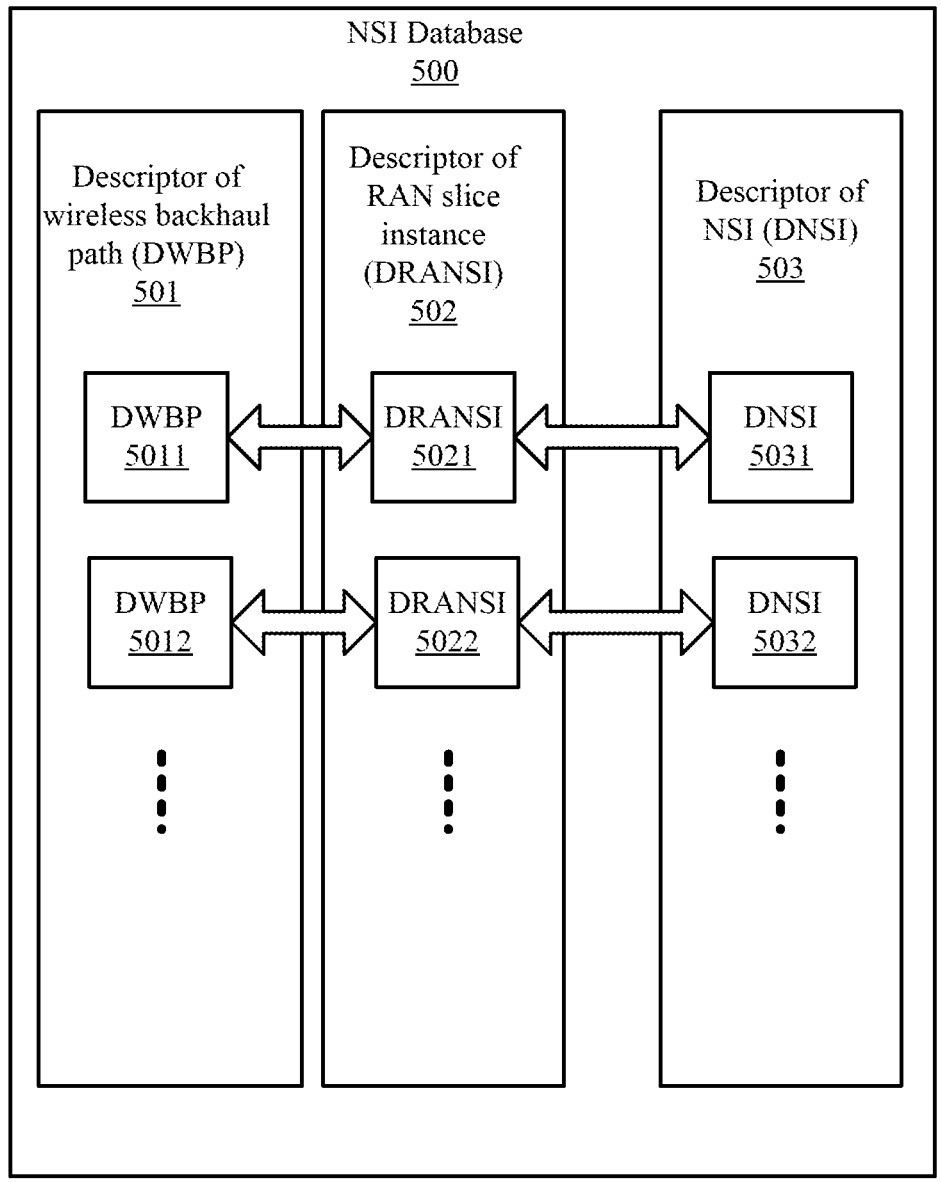
FIG. 11 is schematic view of a network slice instance database associating a descriptor of wireless backhaul paths.

At least a network entity, such as a RAN entity or a core network entity, or a relay UE, such as the relay UE 100a, may obtain a NSI database as shown in FIG. 11.

With reference to FIG. 11, a NSI database 500 associates descriptors of wireless backhaul path (DWBP) 501 with descriptors of RAN slice instance (DRANSI) 502 and descriptors of NSI (DNSI). A DWBP, such as DWBP 5011 or 5012, represents a wireless backhaul path and may comprise ID of the wireless backhaul. A DRANSI, such as DRANSI 5021 or 5022, represents a RAN slice instance and may comprise ID and various information of the RAN slice instance. A DNSI, such as DNSI 5031 or 5032, represents a core network slice instance and may comprise ID and various information of the core network slice instance. Association of a wireless backhaul path, a RAN slice instance, and a core network slice instance is shown as an arrow in FIG. 11.

Figure 12:
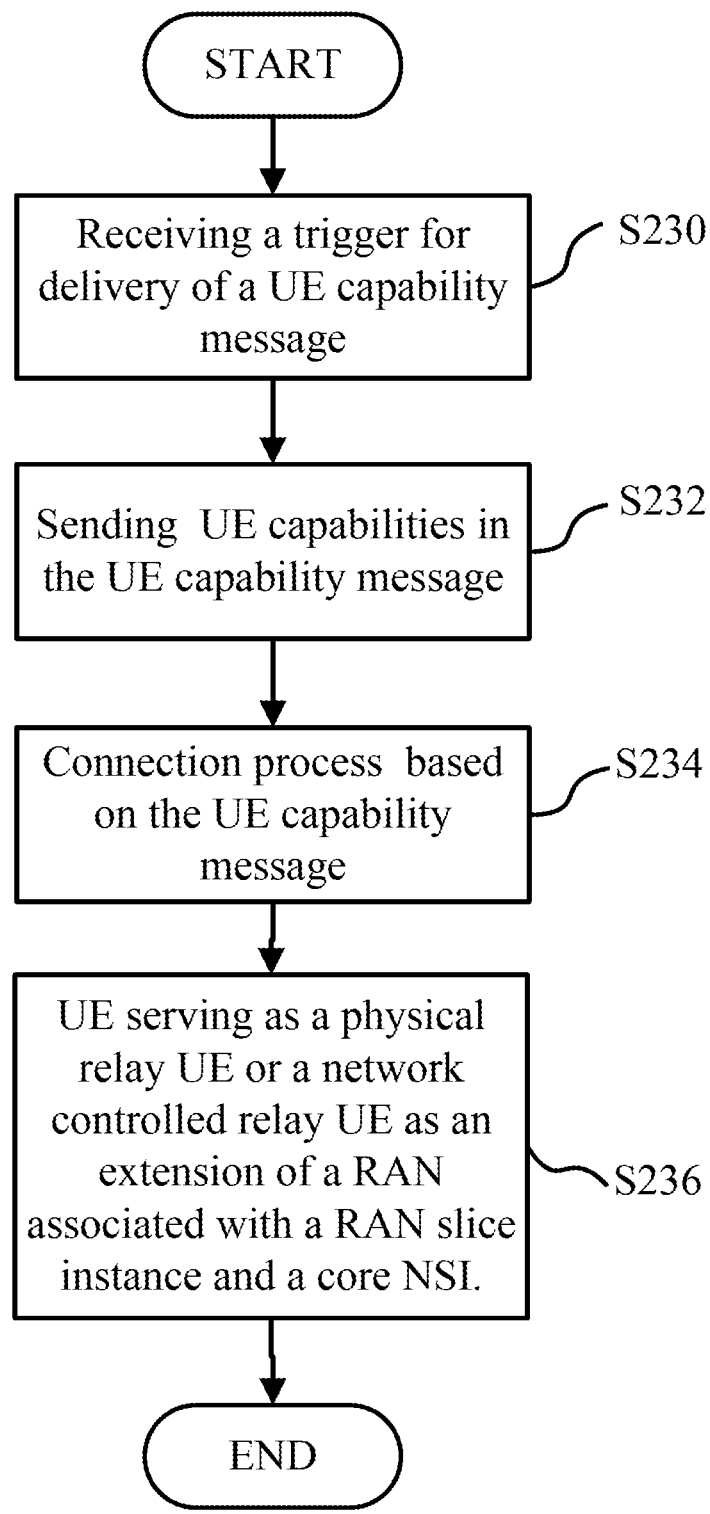
FIG. 12 is a block diagram showing operations of an embodiment of a user equipment (UE) device executing a capability discovery method.

With reference to FIG. 12, a relay UE, such as the relay UE 100a, receives a trigger for delivery of a UE capability message (step S230). The trigger may comprise a notification signal delivered by a component, such as a timer or a user activated input device, of the relay UE. The trigger may comprise a request for the UE capability message which the relay UE received from a request source, such as from another UE referred to as a remote UE, or from a network entity in a radio access network or a public land mobile network (PLMN), or a packet data network, such as Internet.

The relay UE reports UE capabilities of the relay UE by transmitting the UE capabilities in the UE capability message in response to the trigger to the request source (step S232) and initiate a connection process based on the UE capability message (step S234). In the initiated connection based on the UE capability message, the UE serving as a physical relay UE or a network controlled relay UE as an extension of a RAN associated with a RAN slice instance and a core network NSI (step S236). The network controlled relay UE may provide one or more slice instances of virtual relay UEs according to the capabilities of the relay UE.

The UE capability message may comprise a field for accommodating network slicing capability which reflects whether the relay UE is capable of providing only one relay UE slice instance or a plurality of relay UE slice instances. A UE which can provide a plurality of relay UE slice instances may comprise multi-core CPU(s), baseband and RF components and an OS supporting simultaneous execution of the plurality of relay UE slice instances and wireless channels associated with each of the relay UE slice instances. In as embodiment of the disclosure, the capability message may comprise the maximum number of relay UE slice instances the relay UE can provides, the service type of the relay UE slice instances, such as enhanced mobile broadband (eMBB), ultra reliable and low latency communication (URLLC), and massive MTC (mMTC).

The UE capability message may comprise a field for accommodating network slicing capability which reflects whether the relay UE is operable to connect to only one network slice instance or a plurality of network slice instances.

The UE capability message may comprise a field for accommodating network slicing capability which reflects whether the relay UE is capable of supporting a network slice instance requested by a remote UE. The network slice instance may comprise a core network NSI or a RAN NSI associated with a core network NSI.

The UE capability message may comprise a field for accommodating network controlled backhualing capability which reflects whether radio resources allocated to a wireless backhaul connection, a wireless local connection, D2D ProSe connections, and non-3GPP connections of the relay UE is network controllable.

The UE capability message may comprise a field for accommodating intermittent connectivity capability which reflects whether the relay UE is capable of supporting intermittent connectivity communication with a remote UE and an RAN entity.

The UE capability message may comprise a field for accommodating network controlled power saving capability which reflects whether a power saving state of the relay UE is network controllable. For example, the message may comprise information of "NETWORK CONTROLLED POWER SAVING CAPABILITY: TRUE" if the relay UE allows a network entity to control the relay UE to transit from one power state to another power state. Power saving using the schedule for the intermittent connectivity communication is an example of network controlled power saving.

The power saving state of the relay UE is changeable among a plurality of power saving states, one of the plurality of power saving states comprises a state utilizing a nonvolatile random access memory to cache chipset context of the relay UE.

The UE capability message may also comprise an UE identifier (ID), temporary (ID), multi-dimension descriptor (MDD). The UE ID may comprise international mobile subscriber identity (IMSI). The temporary (ID) may comprise next generation (NG) globally unique temporary identity (NGUTI). Some examples of the MDD are disclosed in TR 23.799.

A UE may attach to one or more NSIs. In an embodiment, among a plurality of NSIs attached by the relay UE, one NSI is the primary NSI, and other NSI are secondary NSIs. The UE may obtain information reflecting whether the relay UE is associated with a primary NSI or a secondary NSI. When a plurality of additional relay UE devices are utilized to support multi-hop wireless self-backhauling for the wireless backhaul connection of the relay UE, the UE may obtain a position of the relay UE in the multi-hop backhaul connection. When the UE relay and a plurality of additional relay UE devices are utilized to support topologically redundant connectivity on local D2D connection to a remote UE, the UE may obtain information reflecting whether the relay UE is associated with a primary backhaul path, or a secondary backhaul path to the RAN. When a plurality of additional relay UE devices are utilized to support topologically redundant connectivity on the wireless backhaul connection of the relay UE, the UE may obtain information reflecting whether the relay UE is associated with a primary backhaul path, or a secondary backhaul path, or both. In an embodiment, the information obtained by the relay UE may also be provided in the UE capability message, and may be provided to and configured by a 3rd party application server through a service capability exposure function (SCEF). An example of the SCEF is disclosed in US20160044651A1. The SCEF provide application programming interface (API) for $3^{rd}$ party application server to monitor and configure the relay UE regarding the obtained UE capabilities. For example, the relay UE device 100a may be configured to operate as a part of a multi-hop wireless backhaul connection serving the remote UE 1000, or as a part of topologically redundant wireless backhaul connections serving the remote UE device 1000 according to a service requirement of the remote UE device. The relay UE device 100a may be further configured to be utilized for radio resource aggregation or multi-connectivity channels for the remote UE device 1000 according to a service requirement of the remote UE device 1000. The relay UE 100a may be configured to operate as a part of a primary backhaul path or a secondary backhaul path among the topologically redundant wireless backhaul connections serving the remote UE device 1000 according to a configuration message from a configuration entity, such as the remote UE device 1000. The configuration entity may be a remote UE device, a RAN entity, a core network entity, a relay UE device, or an application server, such as a 3rth parity application server. The RAN entity may comprise a base station, a mobile edge computing (MEC) device. The relay UE device 100a and the configuration entity may exchange messages to realize the capability discovery or the configuration through a SCEF.

Figure 13:
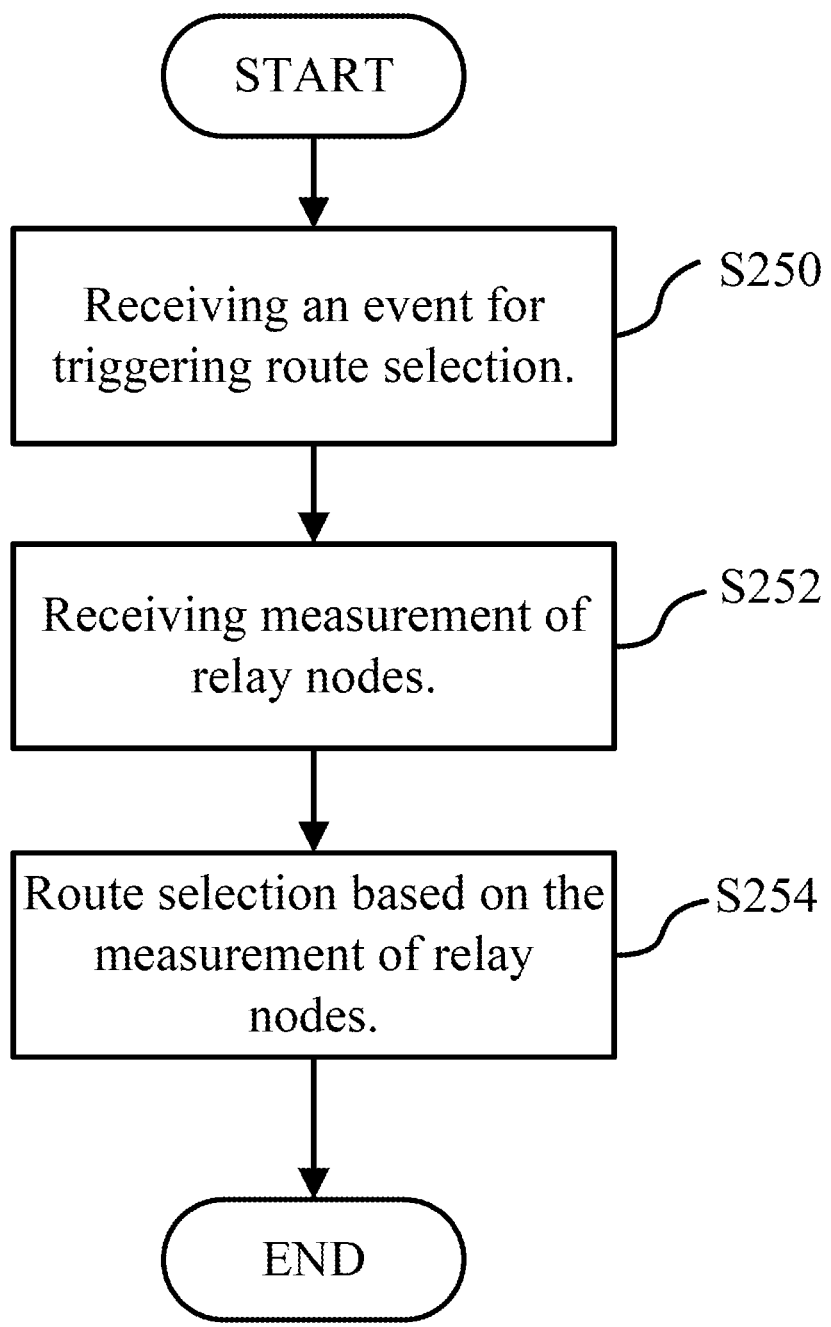
FIG. 13 is a block diagram showing an embodiment of route selection.

With reference to FIG. 13, the device 100 may receive a triggering event for triggering route selection (block S250) and receive measurement of relay nodes as metrics (block S252). The device 100 may regularly and periodically measure performance and cost parameters of relay nodes as the metrics or obtain performance and cost parameters of relay nodes as the metrics in response to the triggering event. The triggering event may include a backhaul change event where at least one relay node moves from one location to another location. The backhaul change event may include at lease one of a cell identifier (cell ID) change event and a signal strength variation event. Alternatively, the triggering event may include a command from a RAN entity or a core network entity for altering topology of a backhaul connection.

The device 100 may detect a backhaul change event associated with a wireless backhaul channel, such as connections 4000, 4001, 4011, 4012, 4013, 4014, 4015, 4016, 4017, 4018, 4020, 4030, 4040, 4050, and 4060, and trigger route selection for the wireless backhaul connection in response to the backhaul change event (block S254). The device 100 performs the route selection by selecting a relay node among a plurality of relay nodes as a next hop node based on metrics of the plurality of relay nodes. Examples of the relay nodes may include devices 100b and 100e. An example of the device 100 includes device 100a. Note that the device 100 is not limited to a relay UE. The device 100 may be a base station.

The metrics of the plurality of relay nodes may include first measurement of unused subscribed data associated with a first subscriber of a first relay node among the plurality of relay nodes, and a second measurement of unused subscribed data associated with a second subscriber of a second relay node among the plurality of relay nodes. The device 100 selects the first relay node as the next hop node when the first measurement of unused subscribed data is greater than the second measurement of unused subscribed data. With reference to FIG. 10C, for example, the device 100a selects the device 100b as the next hop node when the first measurement of unused subscribed data associated with device 100b is greater than the second measurement of unused subscribed data associated with device 100e. Unused subscribed data is a record maintained by a telecommunication operator based on subscription of a subscriber, and is obtained by subtracting used traffic quota from subscribed traffic quota of the subscriber. A subscriber may be identified based on international mobile subscriber identity (IMSI) stored in a subscriber identification module (SIM) card.

The metrics of the plurality of relay nodes may include a first ping response time measurement associated with a first relay node among the plurality of relay nodes, and a second ping response time measurement associated with a second relay node among the plurality of relay nodes. The device 100 selects the first relay node as the next hop node when the first ping response time measurement is less than the second ping response time measurement. With reference to FIG. 10C, for example, the device 100a selects the device 100b as the next hop node when the first ping response time measurement associated with device 100b is less than the second ping response time measurement associated with device 100c. The device 100 may utilize ping response time measurement to represent latency characteristics of a backhaul connection.

The metrics of the plurality of relay nodes may include first signal strength measurement associated with a first relay node among the plurality of relay nodes, and second signal strength measurement associated with a second relay node among the plurality of relay nodes. The device 100 selects the first relay node as the next hop node when the first signal strength measurement is greater than the second signal strength measurement. With reference to FIG. 10C, for example, the device 100a selects the device 100b as the next hop node when the first signal strength measurement associated with device 100b is greater than the second signal strength measurement associated with device 100c.

The device 100 may select the next hop node for forming a wireless backhaul connection based on a service type of a remote UE device or a service type of a network instance associated with the device 100. The device 100 may perform route selection for establishing a wireless backhaul connection through the selected next hop node or steering a wireless backhaul connection from one backhaul path to another backhaul path through the selected next hop node. The device 100 may perform route selection for merging two wireless backhaul connections into one wireless backhaul connection through the selected next hop node. The device 100 may be a UE device or a base station, such as eNB or gNB.

4. Conclusion

In conclusion, one of different levels of garbage collection may be performed between reception of a shutdown command and actual power-off of the device 100. Thus, memory utilization may be well managed to endure long-term usage. Procedures in normal bootstrapping, such as clearing of the main memory 152, and migration of OS kernel, are partially performed prior to actual booting of the device 100 to reduce boot time.

NVRAM may be a key enabler to the rise of machine to machine (M2M) communication, and Internet of things (IoT). Integrating NVRAM as register memory in processors may realize an intermittent connectivity communication between two devices according to an intermittent connectivity communication schedule.

UE capabilities regarding power saving, network slicing, multi-hop self-backhauling, multi-connectivity, and intermittent connectivity may be obtained through a UE, and may be further monitored and configured through a SCEF.

Route selection for a backhaul connection may be determined based on metrics of relay nodes.

It is to be understood, however, that even though numerous characteristics and advantages of the disclosure have been set forth in the foregoing description, together with details of the structure and function of the present disclosure, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A backhaul connection method for a radio node device, executable in the radio node device, comprising:
receiving a radio access network issued configuration message requesting multi-connectivity capability of the radio node device;
providing two wireless communication channels in parallel as a part of the wireless backhaul channel to a radio access network entity in response to the configuration message;
adapting the radio node device to detect a backhaul change event associated with the wireless backhaul channel, and trigger route selection for the wireless backhaul channel in response to the backhaul change event;
performing the route selection by the radio node device performs by selecting a relay node among a plurality of relay nodes as a next hop node based on metrics of the plurality of relay nodes, wherein the metrics of the plurality of relay nodes comprise a first measurement of unused subscribed data associated with a first subscriber of a first relay node among the plurality of relay nodes, and a second measurement of unused subscribed data associated with a second subscriber of a second relay node among the plurality of relay nodes, the radio node device selects the first relay node as the next hop node when the first measurement of unused subscribed data is greater than the second measurement of unused subscribed data.

2. The method of claim 1, further comprising utilizing the radio node device as a mobile terminal and an intermediate node in the wireless backhaul channel.

3. The method of claim 1, wherein radio resources allocated to the wireless backhaul channel of the radio node device is network controllable, and the method further comprising allocating the radio resources to the radio node device a portion for the wireless backhaul channel and a portion for wireless local connections.

4. The method of claim 1, further comprising adapting the radio node device to support a network slice instance requested by a remote user equipment device according to a service type associated with the remote user equipment device.

5. The method of claim 4, further comprising adapting the radio node device to support a radio access network slice instance and a core network slice instance requested by the remote user equipment device according to a service type associated with the remote user equipment device.

6. The method of claim 1, further comprising connecting the radio node device to one or multiple network slice instances according to the received configuration message.

7. The method of claim 1, further comprising providing the radio node device to support one relay node slice instance or multiple relay node slice instances according to the configuration message.

8. The method of claim 1, further comprising establishing a first channel of the two wireless communication channels for transmission of user plane traffic of a remote user equipment device including at least one user plane data packet of the remote user equipment device, and establishing a second channel of the two wireless communication channels for transmission of a duplicated copy of the user plane traffic.

9. A backhaul connection method for a radio node device, executable in the radio node device, comprising:
receiving a radio access network issued configuration message requesting multi-connectivity capability of the radio node device;
providing two wireless communication channels in parallel as a part of a wireless backhaul channel to a radio access network entity in response to the configuration message; and
utilizing the radio node device as a mobile terminal and an intermediate node in the wireless backhaul channel, wherein the intermediate node is operable to provide a local wireless connection to a remote user equipment device;
detecting a backhaul change event associated with the wireless backhaul channel, and triggering route selection for the wireless backhaul channel in response to the backhaul change event;
performing the route selection by selecting a relay node among a plurality of relay nodes as a next hop node based on metrics of the plurality of relay nodes, wherein the metrics of the plurality of relay nodes comprise a first measurement of unused subscribed data associated with a first subscriber of a first relay node among the plurality of relay nodes, and a second measurement of unused subscribed data associated with a second subscriber of a second relay node among the plurality of relay nodes, the radio node device selects the first relay node as the next hop node when the first measurement of unused subscribed data is greater than the second measurement of unused subscribed data.

10. The method of claim 9, further comprising utilizing the radio node device as a part of a multi-hop wireless backhaul connection serving the remote user equipment device according to a service type associated with the remote user equipment device.

11. The method of claim 9, further comprising:
utilizing the radio node device as a part of topologically redundant wireless backhaul connections serving the remote user equipment device according to a service type associated with the remote user equipment device; and
utilizing the radio node device for radio resource aggregation according to the service type associated with the remote user equipment device.

12. The method of claim 11, further comprising utilizing the radio node device as a part of a primary backhaul path or a secondary backhaul path among the topologically redundant wireless backhaul connections serving the remote user equipment device according to a configuration message from the remote user equipment device.

13. The method of claim 11, further comprising utilizing the radio node device as a part of a primary backhaul path or a secondary backhaul path among the topologically redundant wireless backhaul connections serving the remote user equipment device according to a configuration message from the radio access network entity.

14. The method of claim 11, further comprising utilizing the radio node device as a part of a primary backhaul path or a secondary backhaul path among the topologically redundant wireless backhaul connections serving the remote user equipment device according to a configuration message from a third party application server through a service capability exposure function (SCEF).

15. The method of claim 9, wherein the backhaul change event includes at lease least one of a cell identifier change event and a signal strength variation event.

16. The method of claim 9, wherein the metrics of the plurality of relay nodes comprise a first ping response time measurement associated with a first subscriber of a first relay node among the plurality of relay nodes, and a second ping response time measurement associated with a second subscriber of a second relay node among the plurality of relay nodes, the radio node device selects the first relay node as the next hop node when the first ping response time measurement is less than the second ping response time measurement.

* * * * *